United States Patent
Park et al.

(10) Patent No.: US 7,375,404 B2
(45) Date of Patent: May 20, 2008

(54) FABRICATION AND INTEGRATION OF POLYMERIC BIOMEMS

(75) Inventors: Jung Jin Park, Beltsville, MD (US);
Reza Ghodssi, Rockville, MD (US);
Gary W. Rubloff, Clarksville, MD (US); Mark Joseph Kastantin, Goleta, CA (US); Sheng Li, Greenbelt, MD (US); Li-Qun Wu, N. Potomac, MD (US); Hyunmin Yi, Beltsville, MD (US); Theresa Michelle Valentine, Potomac, MD (US)

(73) Assignees: University of Maryland Biotechnology Institute, Baltimore, MD (US);
University of Maryland, College Park, College Park, MD (US)

( * ) Notice: Subject to any disclaimer, the term of this patent is extended or adjusted under 35 U.S.C. 154(b) by 238 days.

(21) Appl. No.: 11/003,005

(22) Filed: Dec. 3, 2004

(65) Prior Publication Data
US 2005/0230767 A1   Oct. 20, 2005

Related U.S. Application Data

(60) Provisional application No. 60/527,394, filed on Dec. 5, 2003, provisional application No. 60/578,207, filed on Jun. 9, 2004.

(51) Int. Cl.
*H01L 27/14* (2006.01)
(52) U.S. Cl. .......................... 257/414; 257/40
(58) Field of Classification Search ............... 257/414, 257/415, 40
See application file for complete search history.

(56) References Cited

U.S. PATENT DOCUMENTS 4,148,689 A   4/1979   Hino et al.

(Continued)

FOREIGN PATENT DOCUMENTS

JP   A 9 239 396   9/1997

(Continued)

OTHER PUBLICATIONS

Sun et al., Tyronsinase-Containing Chitosan Gels: A Combined Catalysts and Sorbent for Selective Phenol Removal. Biotechnology and Bioengineering, vol. 51, pp. 79-86, (1996).

(Continued)

*Primary Examiner*—Tuan H. Nguyen
(74) *Attorney, Agent, or Firm*—Edell, Shapiro & Finnan, LLC; Jeffrey I. Auerbach; June E. Cohan

(57) ABSTRACT

A micro-electro-mechanical system (MEMS) device is provided, along with means for its fabrication and operation for microfluidic and/or biomicrofluidic applications. The MEMS device includes a substrate, optional electrodes on the substrate, a patterned structure on the substrate, the patterned structure having a fluidic microchannel aligned with one or more of the optional electrodes, an encapsulation membrane covering the microchannel, and an optional reactive layer deposited over the electrode in the microchannel. MEMS devices of preferred embodiments permit a leak-tight seal to be formed around the microchannel and fluidic interconnects established for robust operation of fluidics-based processes. MEMS devices of other preferred embodiments permit reversible attachment and separation of the encapsulation membrane relative to the patterned structure.

40 Claims, 9 Drawing Sheets

U.S. PATENT DOCUMENTS

| | | | |
|---|---|---|---|
| 5,015,576 | A | 5/1991 | Nilsson et al. |
| 5,147,698 | A | 9/1992 | Cole |
| 5,422,116 | A | 6/1995 | Yen et al. |
| 5,474,989 | A | 12/1995 | Hashimoto et al. |
| 5,658,592 | A | 8/1997 | Tanihara et al. |
| 5,830,459 | A | 11/1998 | Cuero et al. |
| 6,044,800 | A | 4/2000 | Kubo et al. |
| 6,245,901 | B1 | 6/2001 | Von der Osten et al. |
| 6,503,847 | B2* | 1/2003 | Chen et al. ............. 438/780 |
| 6,562,363 | B1 | 5/2003 | Mantelle et al. |
| 6,623,950 | B1 | 9/2003 | Von der Osten et al. |
| 6,638,621 | B2 | 10/2003 | Anderson et al. |
| 6,951,632 | B2* | 10/2005 | Unger et al. ............. 422/100 |
| 2002/0084194 | A1 | 7/2002 | Redepenning |
| 2003/0170966 | A1* | 9/2003 | Lutz ........................ 438/456 |
| 2006/0078962 | A1 | 4/2006 | Chen et al. |

FOREIGN PATENT DOCUMENTS

| | | |
|---|---|---|
| JP | 310041 | 11/1998 |
| WO | WO 00/11038 | 3/2000 |
| WO | WO 2004/018741 | 3/2004 |

OTHER PUBLICATIONS

Tatsumi, K. et al., Removal of Phenols from Wastewater by an Enzyme and Chitosan, Advances in Chitin Sciences, vol. 2, pp. 864-869 (1997).

Muzzarelli, et al.,TYrosinase-Mediated Quinone Tanning of Chitinous Materials, Carbohydrate Polymers, vol. 24, pp. 295-300 (1994).

Wada et al., "Removal of Phenols and Aromatic Amines from Wastewater by a Combination . . . a Coagulent," Biotechnology and Bioengineering, vol. 45, pp. 304-309 (1995).

Payne et al., "Tyrosinase Reaction/Chitosan Adsorption for Selectively Removing Phenols from Aqueous Mixtures," Biotechnology & Bioengineering, 40, No. 9 (1992).

Seong, et al., "Fabrication of Microchambers Defined by Photopolymerized Hydrogels and Weirs . . . ," Analytical Chemistry, vol. 74, No. 14, pp. 3372-3377 (2002).

Gao, et al., "Lateral Patterning of CDTe Nanocrystal Films by the Electric Field Directed Layer-by-Layer Assembly Method," Langmuir, vol. 18, pp. 4098-4102 (2002).

Chen et al., "pH-Sensitive Thin Hydrogel Microfabricated by Photolithography," Langmuir, vol. 14, pp. 6610-6612 (1998).

Beebe, et al., "Functional Hydrogel Structures for Autonomous Flow Control Inside Microfluidic Channels," Nature, vol. 404, pp. 588-590 (2000).

Sirkar et al., "Amperometric Biosensors Based on Oxidoreductases Immobilized in Photopolymerized . . . ," Analytic Chemistry, vol. 70, No. 14, pp. 2888-2984 (1998).

Li-Qun Wu, et al., "Chitosan-Mediated and Spatially Selective Electrodeposition of Nanoscale Particles," Langmuir, vol. 21, No. 8, pp. 3641-3646 (2005).

Li-Qun Wu, et al., "Spatially Selective Deposition of a Reactive Polysaccharide Chitosan Layer onto a Patterned Template," Langmuir, vol. 19, No. 3, pp. 519-524 (2003).

Li-Qun Wu, et al., "Voltage-Dependent Assembly of the Polysaccharide Chitosan onto an Electrode Surface," Langmuir, vol. 18, No. 22, pp. 8620-8625 (2002).

Tianhong Chen, et al., "Enzymatic Methods for in Situ Cell Entrapment and Cell Release," Biomacromolecules, vol. 4, No. 6, pp. 1558-1563 (2003).

Mark J. Kkastantin, et al., "Integrated Fabrication of Polymeric Devices for Biological Applications," Invited Paper, Journal of Sensors and Materials, pp. 1-18 (Sep. 2003).

Tianhong Chen, et al., "Nature-Inspired Creation of Protein Polysaccharide Conjugate and Its Subsequent . . . Patterned Surface," Langmuir, vol. 19, No. 22, pp. 9382-9386 (2003).

Rohan Fernandes, et al., "Electrochemical Induced Deposition of a Polysaccharide Hydrogel onto a Patterned Surface," Langmuir vol. 19, No. 10, pp. 4058-4062 (2003).

Hyunmin, Yi, et al., "A Robust Technique for Assembly of Nucleic Acid Hybridization . . . Chitosan," Analytical Chemistry, vol. 76, No. 2, pp. 365-372 (Jan. 15, 2004).

Rohan Fernandes, et al., "Thermo-Biolithography: A Technique for Patterning Nucleic Acids and Proteins," Langmuir, vol. 20, No. 3, pp. 906-913 (2004).

Li-Qun Wu, et al., "Spatially Selective Asembly of a Reactive Polysaccharide Layer onto Patterned Surfaces," Power Point Presentation of Nov. 8, 2002 (22 slides).

Takenaka, et al., "Sol-gel Preparation of a Single Layer, 0.75 Micron Thick Lead Zirconate Titanate Films . . . ," Applied Physics Letters, vol. 79, No. 21, pp. 3485-3487 (2001).

O'Connor, et al., "Immobilization of Neural Cells in Three-Dimensional Matricesfor Biosensor Applications," Biosensors & Bioelectrics, vol. 14, pp. 871-881 (2000).

Zhitomirsky, et al., "Cathodic Electrodeposition of Polymer Films and Organoceramic Films," Material Science and Engineering, vol. B78, pp. 125-130 (2000).

Chen, et al., "Self-Assembly of Monolayers of Cadmium Selenide Nanocrystals with Dual Color Emission," Langmuir, vol. 15, pp. 6845-6850 (1999).

Clark, "Engineering the Microfabrication of Layer-by-Layer Thin Films," Advanced Materials (1998).

Gray, et al., "Interlocking Mechanical and Fluidic Interconnections for Microfluidic Circuit Boards", Sensors and Actuators a-Physical, vol. 112, No. 1, pp. 18-24, 2004.

Li, et al., "Fabrication of Micronozzles Using Low-temperature Wafer-level Bonding with SU-8",Journal of Micromechanics and Microengineering,vol. 13, No. 5, pp. 732-738, 2003.

Duffy, et al., "Rapid Prototyping of Microfluidic Systems in Poly (dimethylsiloxane)." Analytical Chemistry, vol. 70, No. 23, pp. 4974-4984, 1998.

Harrison, et al., "Capillary Electrophoresis and Sample Injection Systems Intergrated on a Planar Glass Chip", Analytical Chemistry, vol. 64, No. 17, pp. 1926-1932, 1996.

Liang, et al., "Microfabrication of a Planar Absorbance and Fluorescence Cell for Integrated Capillary Electrophoresis Devices", Analytical Chemistry, vol. 68, pp. 1040-1046,1996.

Voldman, et al., "An Integrated Liquid Mixer/Valve", Journal of Microelectromechanical Systems, vol. 9, No. 3, pp. 295-302, 2001.

Glasgow, et al., "Handling Individual Mammalian Embryos Using Microfluidics", IEEE Transactions on Biomedical Engineering, vol. 48, No. 5, pp. 570-577, 2001.

Fujii, et al., "PDMS-based Microfluidic Device for Biomedical Applications", Microelectronic Engineering, vol. 61-62, pp. 907-914, 2002.

Yamaguchi, et al., "Rapid Fabrication of Electrochemical Enzyme Sensor Chip Using Polydimethylsiloxane Microfluidic Channel", Analytica Chemica Acta,vol. 468, pp. 143-152, 2002.

Kim, et al., "A New Monolithic Microbiosensor for Whole Blood Analysis", Sensors and Actuators, vol. A 95, pp. 108-113, 2002.

Trumbull, et al., "Integrating Microfabricated Fluidic Systems and NMR Spectroscopy", IEEEE Transactions on Biomedical Engineering, vol. 47, No. 1, pp. 3-7, 2000.

Krishnan, et al., "Microfabricated Reaction and Separation Systems", Curr. Opinion Biotech, vol. 12, pp. 92-98, 2001.

Hatch, et al., "A Ferrofluidic Magnetic Micropump", Journal of Microelectromechanical Systems, vol. 10, No. 2, pp. 215-221, 2001.

Xia, et al., "Soft Lithography", Angew. Chem. Int. Ed. vol. 37, pp. 550-575, 1998.

Boer, et al., "Micromachining of Buried Micro Channels in Silicon", Journal of Microelectromechanical Systems, vol. 9, No. 1, pp. 94-103, 2000.

Kovacs, et al., "Bulk Micromachining of Silicon", Proceedings of IEEE, vol. 86, No. 8, pp. 1536-1551, 1998.

Bustillo, et al., "Surface Micromachining for Microelectromechanical Systems", vol. Proceedings of IEEE, vol. 86, No. 8, pp. 1552-1574, 1998.

Lin, et al., "A Fast Prototyping Process for Fabrication of Microfluidic Systems on Soda-lime Glass",Journal of Micromechanics and Microengineering, vol. 11, pp. 726-732, 2001.

Morgan, et al., "Compensated Aspect Ratio Dependent Etching (CARDE) Using Gray-scale Technology", Microelectronic Engineering, vol. 77, pp. 85-94, 2005.

Waits, et al., "Investigatino of Gray-scale Technology for Large Area 3D Silicon MEMS Structures", Journal of Micromechanics and Microengineering, vol. 13, pp. 170-177, 2003.

Beebe, et al., "Physics and Application of Microfluidics in Biology", Annual Review of Biomedical Engineering, vol. 4, pp. 261-286, 2002.

Jacobson, et al., "High-Speed Separations on a Microchip", Anal. Chem., vol. 66, pp. 1114-1118, 1994.

Erickson, et al., "Integrated Microfluidic Devices", Analytica Chimica Acta, Vo. 507, No. 1, pp. 11-26, 2004.

Han, et al., "An Approach to Multilayer Microfluidic Systems with Integrated Electrical, Optical, and Mechanical Functionality", IEEE Sensors Journal, vol. 5, No. 1, pp. 82-89, 2005.

Fujii, Teruo, "PDMS-based Microfluidic Devices for Biomedical Applications", Microelectronic Engineering, 61-62, pp. 907-914, 2002.

* cited by examiner

FABRICATION AND INTEGRATION OF POLYMERIC BIOMEMS

RELATED APPLICATIONS

This application claims the benefit of priority of U.S. provisional application Ser. No. 60/527,394 filed in the U.S. Patent & Trademark Office on Dec. 5, 2003 entitled "Fabrication and Integration of Polymeric BioMEMS," the complete disclosure of which is incorporated herein by reference.

This application also claims the benefit of priority of U.S. provisional application Ser. No. 60/578,207 filed in the U.S. Patent & Trademark Office on Jun. 9, 2004 entitled "Micro-Knife-Edge Technique for Sealing of Microfluidic Systems," the complete disclosure of which is incorporated herein by reference.

GOVERNMENT LICENSING CLAUSE

The U.S. Government has a paid-up license in this invention and the right in limited circumstances to require the patent owner to license others on reasonable terms as provided for by the terms of Grant No. DMR 4-32291 awarded by the National Science Foundation.

BACKGROUND OF THE INVENTION

1. Field of the Invention

This invention relates generally to micro-fluidic biological micro-electro-mechanical systems (MEMS).

2. Description of Related Art

The use of micro-electro-mechanical systems (MEMS) in biological research is becoming increasingly common. Micro-devices allow for relatively easy observation and manipulation of individual cells, proteins, or other biological macromolecules. Sample sizes for such experiments may be reduced when using MEMS as compared to traditional techniques. J. D. Trumbull, et al., *IEEE Transactions on Biomed. Eng.* 47, 3 (2000). This allows biological systems to be studied at a new level of resolution while minimizing the materials required for an experiment.

Initially, microfluidic devices were used primarily for capillary electrophoresis. S. Jacobson, et al., *Anal. Chem.* 66 (1994) 1114; D. J. Harrison, et al., *Anal. Chem.* 64 (1992) 1926; Z. Liang, et al.; *Anal. Chem.* 68 (1996) 1040. Recently, there has been interest in incorporating a complete array of functional units, e.g., valves, pumps, reaction chambers, etc., onto a single chip to create a lab-on-a-chip (LOC). J. Voldman, et al., *J. Microelectromech. Sys.* 9 (2000) 295; I. Glasgow, et al., *IEEE Transactions on Biomed. Eng.* 48 (2001) 570; T. Fujii, *Microelectronic Eng.*, 61-62 (2002) 907; A. Yamaguchi, et al., *Analytical Chimica Acta.*, 468 (2002) 143; J. H. Kim, et al., *Sensors and Actuators A.* 95 (2002) 108; M. Krishnan, et al., *Curr. Opinion Biotech.* 12 (2001) 92; A. Hatch, et al., *J. Microelectromech. Sys.* 10 (2002) 215.

The ability to create MEMS and other devices such as biosensors and microarrays requires facile methods to precisely control surfaces. A variety of patterning techniques can be used to produce desired structures, while various methods have been investigated to control surface chemistries. For instance, microfabrication techniques are routinely applied to create patterned inorganic surfaces with nanometer to micrometer scale resolution. Xia, Y., et al., *Angew. Chem, Int. Ed. Engl.*, 37, 550-575 (1998).

A variety of methods are presently available for fabrication of microfluidic devices. Channels can be micromachined into silicon using traditional microelectronics techniques. M. de Boer, et al., *J. Microelectromech. Sys.* 9, 94 (2000); G. Kovacs, et al., *Proc. IEEE*, 86, 1536 (1998); J. Bustillo, et al., *Proc. IEEE*, 86, 1552 (1998). Glass can be a substrate for biological applications, allowing for visual observation of activity inside the channel. C. H. Lin, et al. *J. Micromech. Microeng.*, 11, 726 (2001). However, glass and silicon processing are expensive and time-consuming, and often require hazardous chemicals and expensive machinery.

Other drawbacks limit the effectiveness of conventional microfluidic devices. For example, current technology relies heavily on either manual alignment of bio-MEMS layers or complex and expensive thin film and lithographic processing techniques to ensure alignment. Current technology also relies on single-level microfluidic devices in which fluid insertion is carried out by microsyringes, exploiting capillary action and sometimes electrokinetics. In some cases, fluidic inputs and outputs have been construed by manual alignment of fluidic connections to the bioMEMS and subsequent hand-gluing of the seals. Neither of these approaches readily enables leak-tight fluidic sealing or direct integration of the inputs/outputs with the package level.

SUMMARY OF THE INVENTION

It is an object of the invention to provide a micro-electro-mechanical system (MEMS) device and method that permit easy alignment and reversible removal and attachment of layers.

Another object of the present invention is to provide a micro-electro-mechanical system (MEMS) device and method capable of fluid insertion and removal without requiring microsyringes or deconstruction of the system.

It is another object of the present invention to provide a micro-electro-mechanical system device and method that provide a fluid-tight seal around a microfluidic circuit comprising, for example, micro-channels and micro-reservoirs.

It is a further object of the present invention to provide a micro-electro-mechanical system device and method for controlling the deposition and conjugation of biomolecules, cells, and/or cellular species, onto an organic reactive layer, such as a polysaccharide mass.

To achieve one or more of the foregoing objects, and in accordance with the purposes of the invention as embodied and broadly described herein, an aspect of this invention provides a micro-electro-mechanical system (MEMS) device comprising a substrate, a patterned structure having a microchannel provided on the substrate, and an encapsulation membrane covering the microchannel. The encapsulation membrane is reversibly attachable and separable with respect to the patterned structure.

According to a second aspect of the invention, a micro-electro-mechanical system (MEMS) device is provided. The system comprises a substrate, a patterned structure on the substrate comprising SU-8 and having a microchannel, and a polydimethylsiloxane encapsulation membrane covering the microchannel.

A third aspect of the invention provides a micro-electro-mechanical system (MEMS) device, comprising a substrate, a patterned structure on the substrate having a microchannel, and an encapsulation membrane covering the microchannel. The patterned structure comprises an inlet reservoir and outlet reservoir connected via the microchannel. The encapsulation membrane comprises an inlet port in fluid communication with the inlet reservoir and an outlet port in fluid communication with the outlet reservoir for permitting introduction of fluid to the system and removal of fluid from the system without removal of the encapsulation membrane.

In accordance with a fourth aspect of the invention, there is provided a micro-electro-mechanical system (MEMS) device, comprising a substrate, a patterned structure on the substrate, and a compressible sealing layer. The patterned structure comprises a patterned layer having a microchannel, and a ridge protruding from the patterned layer and surrounding the microchannel. The compressible sealing layer covers the microchannel and is compressed against the ridge to provide a leak-tight seal.

A fifth aspect of the invention provides a micro-electro-mechanical system (MEMS) device comprising a substrate, a patterned ridge structure on the substrate, the patterned ridge structure forming and surrounding a microchannel, and a compressible sealing layer covering the microchannel and compressed against the ridge structure to provide a leak-tight seal.

According to another aspect of the invention, methods are provided for transporting fluids in the above-described MEMS devices.

According to another aspect of the invention, methods are provided for depositing biomolecules and/or cellular species in the microfluidic systems of the MEMS devices.

According to still another aspect of the invention, methods are provided for making the MEMS devices of the invention.

BRIEF DESCRIPTION OF THE DRAWINGS

The accompanying drawings are incorporated in and constitute a part of the specification. The drawings, together with the general description given above and the detailed description of the certain preferred embodiments and methods given below, serve to explain the principles of the invention.

DETAILED DESCRIPTION OF PREFERRED EMBODIMENTS AND PREFERRED METHODS

Reference will now be made in detail to the presently preferred embodiments and methods of the invention as illustrated in the accompanying drawings. It should be noted, however, that the invention in its broader aspects is not limited to the specific details, representative assemblies and methods, and illustrative examples shown and described in this section in connection with the preferred embodiments and methods. The invention according to its various aspects is particularly pointed out and distinctly claimed in the attached claims read in view of this specification, and appropriate equivalents.

It is to be noted that, as used in the specification and the appended claims, the singular forms "a," "an," and "the" include plural referents unless the context clearly dictates otherwise.

First Embodiment

Figure 1:
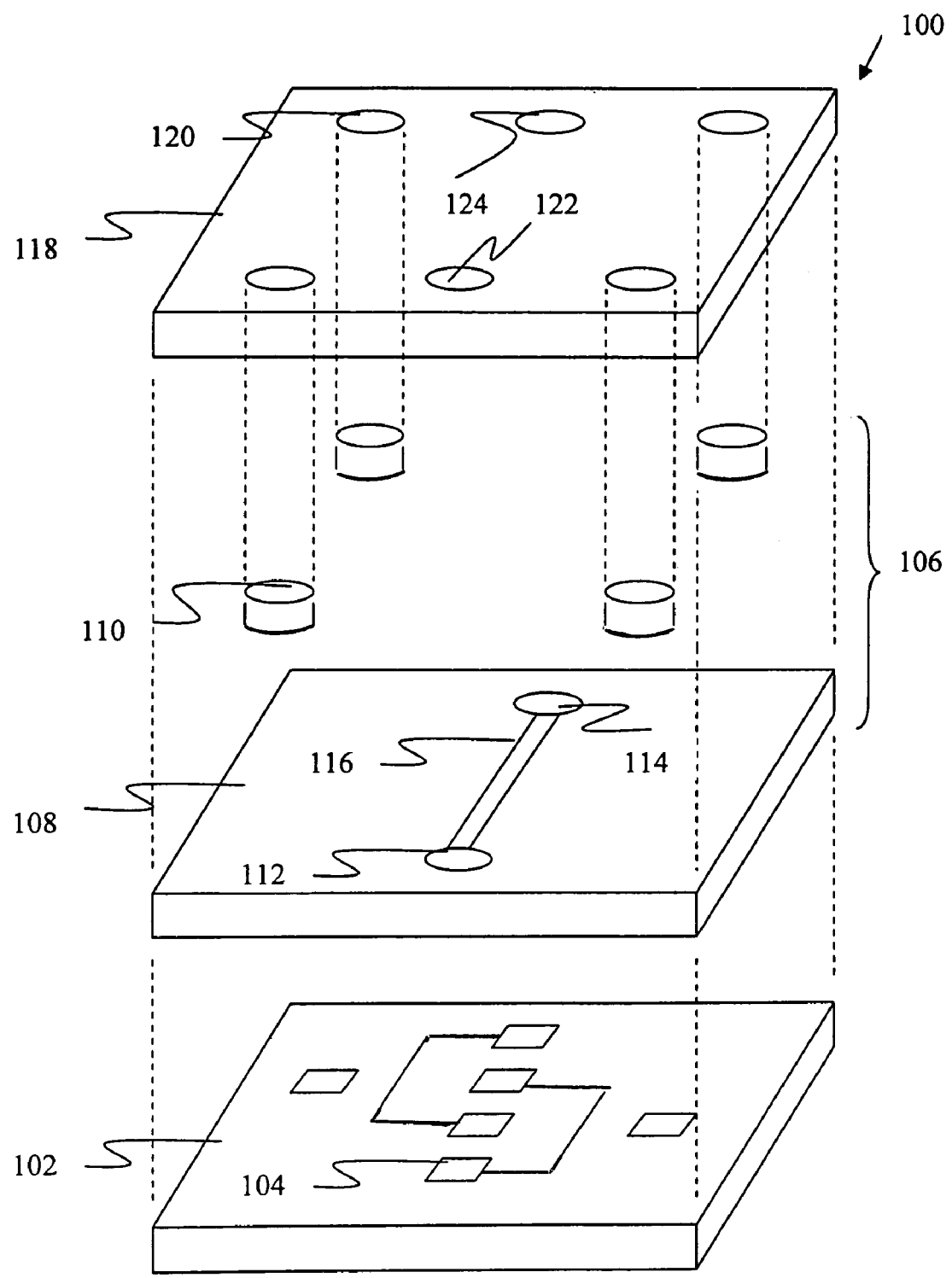
FIG. 1 shows an exploded perspective view of a micro-electro-mechanical system (MEMS) device according to a first embodiment of the invention.

According to a first embodiment of the present invention illustrated in FIG. 1, micro-electro-mechanical system (MEMS) device 100 comprises a substrate 102 comprising a plurality of electrodes 104 situated on an upper surface of substrate 102. The electrodes 104 include at least one anode and at least one cathode. A patterned structure 106 is situated over a portion or all of substrate 102. Patterned structure 106 comprises a first patterned layer 108 and a second patterned layer 110. First patterned layer 108 comprises a first reservoir 112, a second reservoir 114, and a microchannel 116 connecting reservoirs 112 and 114 to one another. Microchannel 116 is situated directly over at least one of electrodes 104. Second patterned layer 110 is deposited on first patterned layer 108 and is configured as a plurality of cylindrical posts. An encapsulation membrane 118 is deposited on first patterned layer 108 and covers microchannel 116 and reservoirs 112 and 114. Encapsulation membrane 118 comprises a plurality of holes or apertures 120 aligned with corresponding ones of cylindrical posts 110. Apertures 120 are sized slightly larger than posts 108 to receive posts 110 in a snug yet releasable manner. Alternatively, apertures 120 may be slightly smaller than posts 108 if encapsulation membrane 118 is a flexible material. Encapsulation membrane 118 also comprises an inlet port 122 and an outlet port 124 aligned directly over first reservoir 112 and second reservoir 114, respectively. A reactive layer 126 (FIGS. 5G and 5H) is deposited in microchannel 116 over one or more of electrodes 104.

MEMS device 100 and its various components will now be discussed in greater detail in connection with FIGS. 2A to 2F, 3, 4, 5A to 5H, and 6A to 6D.

The description below allows for synthesizing all-polymeric, microfluidic bio-MEMS devices. Polymer functional groups provide an interface between the inert, structural aspects of a device and the biological components in a MEMS device. Rather than simply housing reactants, polymer properties can be tailored to provide an environment in which to sustain biological species. However, it should be understood that the bioMEMS systems may comprise materials other than polymers. It also is to be understood that the following description of components and their characteristics and functions is presented by way of example, and not necessarily limitation.

Substrate

Substrate 102 in FIG. 1 comprises a platform, wafer, or support on which electrodes 104 and patterned structure 106 may be formed, transferred to, or otherwise provided. Substrate 102 may comprise one or more materials, may be homogeneous or heterogeneous, and may contain a surface film, such as an oxide layer. The substrate surface may be flat, curved, multi-leveled, etc. Substrate 102 and the substrate surface are preferably substantially electrically non-conducting. Substrate 102 may be made of an inorganic material such as, but not necessarily limited to, a silicon wafer optionally having a surface oxide film. Other suitable inorganic materials include silicon oxide, silicon nitride, the like, and others, including forms such as pyrex or glass. Organic or polymeric materials may be employed as well, such as polyimide or plastic.

Electrodes

Electrodes 104 in FIG. 1 and FIG. 5 may serve one or more of several functions in the MEMS device 100. For example, electrodes 104 are often used to record electrical activity from cells. Properly placed electrodes 104 can record the activity from a single cell that rests on top of it. Additionally, electrodes 104 can be used for flow actuation. Some charged materials undergo conformational changes during an applied potential. Ferrofluids can also be attracted to an electrode, preventing fluid flow and acting as a valve.

The material or materials selected for the electrodes may be those upon which a reactive layer 126 (e.g., chitosan) may be deposited via electrochemical deposition. Suitable materials include but are not necessarily limited to metals (e.g., aluminum, chromium, cobalt, copper, gold, nickel, palladium, platinum, silver, tungsten, zinc), metal alloys, semiconductors, and conductive polymers (e.g., polypyrrole, etc.).

It is preferred that electrodes 104 comprise either a chemically inert metal (e.g., Au, Pt) or a conductive polymeric surface layer, and more preferably polypyrrole (PPy). Polypyrrole and other conductive polymers add utility to MEMS device 100 for use in biological experiments. Long-term compatibility of MEMS device 100 with mammalian cells is improved by using highly conducting polypyrrole instead of conductive materials such as gold. Further, polypyrrole is inexpensive and easy to use. For example, polypyrrole can be easily deposited electrochemically due to aqueous solubility and low oxidation potential of the monomer. Polypyrrole also can be solution cast. Anionic doping of polypyrrole enhances the conductivity as well as the hydrolytic stability of the film.

Figure 2A:
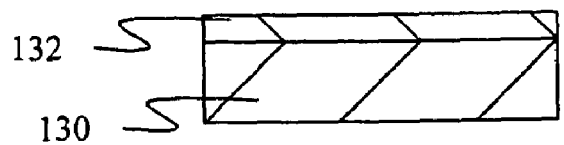
FIGS. 2A through 2E are cross-sectional views of a test structure for measurement of conductivity of a MEMS electrode, the views having been taken along sectional line II-II of FIG. 2F.
Figure 2B:
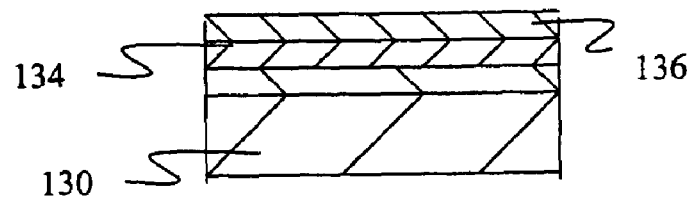
Figure 2C:
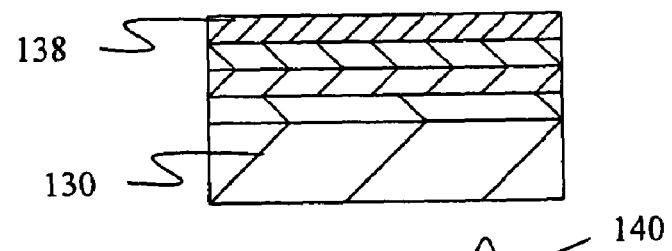
Figure 2D:
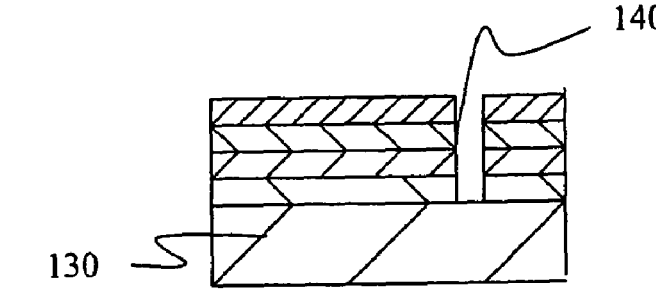
Figure 2E:
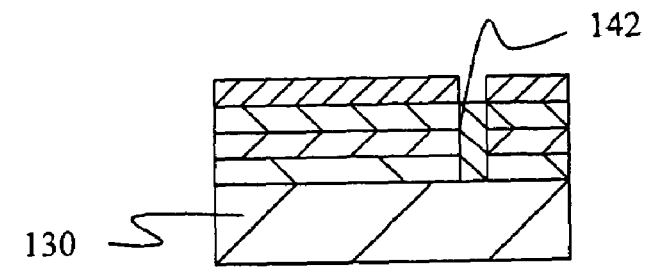
Figure 2F:
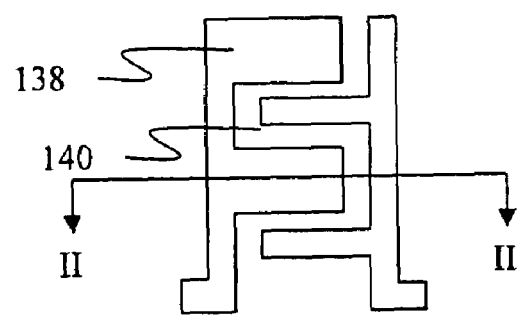

Polypyrrole can be deposited for use as an electrode such as 104 in FIG. 1. FIGS. 2A-2F illustrate a method for designing and fabricating test structures useful in the measurement of polypyrrole film conductivity. First, a chromium layer 134 (30 Å thick) was deposited on a silicon wafer 130 already coated with 1 μm thick thermal $SiO_2$ surface layer 132. Next, a layer 136 of gold (2000 Å thick) was evaporated on chromium layer 134. Photoresist 138 was spun and patterned on the top of gold layer 136 using the mask pattern to produce a pattern shown in top view in FIG. 2F, where the two island elements will be left as the chrome/gold electrodes between which polypyrrole will be deposited as a connection layer 142. Gold layer 136 and chromium layer 134 were patterned with wet chemical etching using gold and chromium etchants, respectively, to form a 40 μm wide serpentine trench 140. Polypyrrole film 142 was then electrochemically deposited from a solution of 0.1 M pyrrole (Aldrich) and 0.1 M NaDBS (Aldrich) in trench 140 as shown in FIGS. 2D and 2E. Thickness and resistance of polypyrrole film 142 deposited in trench 140 were measured using a profilometer and a probe station, respectively. According to one example, polypyrrole film 142 thickness was measured at 1.89 microns±0.03 microns using a P-1 Tencor contact profilometer. Although film thickness was substantially uniform, thickness varied from test-to-test, depending upon several factors, including polymerization time and applied voltage.

Figure 3:
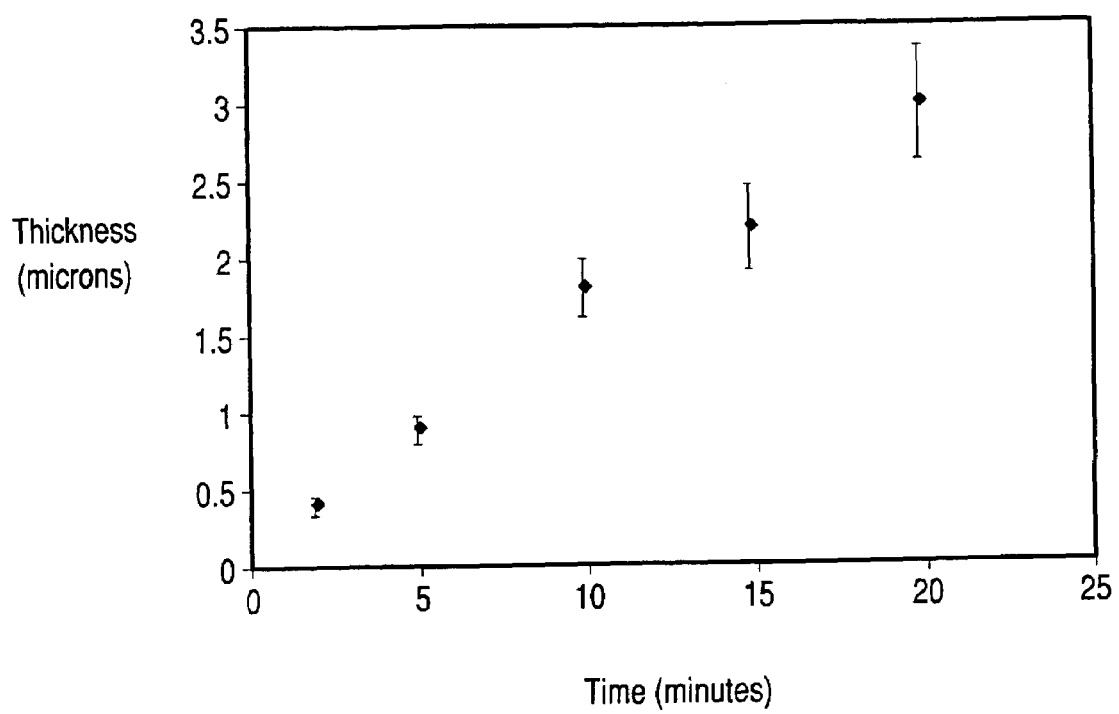
FIG. 3 is a plot of electrode thickness as a function of deposition time.

The thickness of polypyrrole film 142 is plotted as a function of deposition time in FIG. 3 at the constant applied potential of 0.55 V (vs. an Ag/AgCl reference electrode). The data show that film growth is linear. Thus, as long as a constant concentration of monomer is maintained in the aqueous solution, the rate of film growth should be constant at that voltage.

Electrical conductivity of the PPy film was then calculated as the inverse of the resistivity of the sample using the following equation:

$$\sigma = 1/\rho = L/RS$$

where σ, ρ, R, L and S are the conductivity, resistivity, resistance, length and cross section area of polypyrrole film 142 filled in trench 140, respectively. The average conductivity of polypyrrole film was determined to be 47±5 S/cm. This is higher than the 8.3 S/cm reported by Omastova et. al. for NaDBS doped polypyrrole films, but well within the range proposed by Gardner and Bartlett ($10^{-5}$ to $10^2$ S/cm) for polypyrrole films in general. The discrepancy is attributed to different preparation methods, doping levels, and evaluation techniques used for polypyrrole films.

It is to be understood that although the first embodiment described and illustrated herein includes electrodes, the invention in its broader aspects encompasses MEMS devices and methods without electrodes. For example, the MEMS device may be used to control flow of a fluid (i.e., a liquid and/or gas) through a micro-channel, without depositing a reactive layer (with or without conjugated molecules) over an electrode in the micro-channel.

Patterned Structure

First and second layers 108 and 110 of patterned structure 106 are preferably insulators made of a material capable of functioning as a photoresist for patterning. A photosensitive material suitable to be left in place after patterning and used for device structures is desirable because it simplifies the processing sequence. Preferably, SU-8, an epoxy resin, is the material of choice and acts as a negative photoresist during processing. When exposed to UV light, a Lewis acid catalyzes the hydroxyl coupling of the SU-8 epoxy rings, forming a solid, cross-linked polymer matrix. SU-8 is useful for microfluidics because it can produce well-defined, high aspect ratio structures. Complex multi-layer surfaces can be created in this manner. Other photoresist materials are suitable for combined patterning and subsequent use is known, generally referred to as photoimagable dielectrics.

Alternatively, one could use more conventional lithographic approaches, where a layer destined to serve as e.g. 108 is patterned and etched by a sacrificial photoresist layer.

A two-level SU-8 formation is used as patterned structure 106 of MEMS device 100. First patterned layer 108 forms the structural material for micro-channel 116 and reservoirs 112 and 114, while second patterned layer 110 is used to align encapsulating layer 118 with fluidic components in first patterned layer 108. Microchannel 116 and reservoirs 112 and 114 may be patterned using conventional techniques to process the SU-8 photoimagable dielectric, such as photolithographic-based processes. Processing of SU-8 usually involves only a contact aligner for lithography and a few solvents.

As referred to herein, micro-channel includes microfluidic structures capable of transporting or storing fluid. Microchannel 116 is depicted in the figures as an elongated trench having parallel sides and a uniform width. It should be understood that the micro-channel may take other configurations, such as that of a pocket, groove, passage, mouth, etc., and other characteristics, such as non-linear (curved) or non-parallel sides. Microchannel dimensions for microfluidics are typically in the range of 10 to 500 microns in width and depth, with lengths, for example, from 100 to 5000 microns. However, the concepts and invention described herein apply to nanoscale regimes for nanofluidics, in which case one can expect widths and depths of about 0.005 microns (5 nm) to 0.010 microns (10 nm), and lengths of about 0.01 microns (10 nm). For the purposes of this disclosure, such nanoscale regimes may be considered micro-fluidics.

Although the embodiment illustrated in FIG. 1 includes one inlet reservoir 112, one outlet reservoir 114, and one microchannel 116, it should be understood that multiple inlet and/or outlet reservoirs and complex channel structures can be formed. These and other additional structure are fabricated, for example, by modification of the photolithographic masks used for patterning layer 108 and/or encapsulating membrane 118. Further, similar techniques can be employed to make a variety of other structures, e.g., pumps, valves, etc. of the microfluidic system.

In this regard, the terms pattern and patterned refer to the spatial localization of a material. The pattern may extend across the entire surface of patterned layer 108, or may be localized on a single surface portion. Multiple patterns may be present on a single surface. A pattern may comprise a repeating arrangement of objects or shapes, a non-repeating or random arrangement of objects or shapes, a particular defined shape, array, or the like. For example, the pattern may comprise a plurality of parallel lines spaced apart from one another by uniform or non-uniform intervals, cylindrical members, e.g., posts 120, etc.

Encapsulating Membrane

Encapsulation membrane (or layer) 118 in FIG. 1 preferably is made of a flexible polymeric material, and more preferably comprises and optionally consists essentially of or consists of polydimethylsiloxane (PDMS). PDMS is a tough elastomer that is relatively inexpensive and easy to work with. PDMS is non-polar, and relatively impermeable to aqueous solutions. Other materials such as polyimide or polytetrafluoroethylene (TEFLON) may be used as alternatives to PDMS.

As discussed in greater detail below in connection with FIGS. 6A to 6D, PDMS can be molded against a master (e.g., SU-8 or silicon) to create the desired surface structures, such as shown in FIG. 1. In many applications, PDMS is typically poured onto a master or template so as to completely cover the template. This results in patterning only on one side of membrane 118, namely that in contact with the template. Conventional photolithographic-based processes may be used to pattern the other side of membrane 118, if desired.

Alternatively, because PDMS thickness and patterning can be controlled by spin-casting, a PDMS encapsulation layer 118 can be created in one step to serve the function depicted in FIG. 1. To accomplish this, the template on which the PDMS is poured may contain large posts. As shown in FIGS. 6A to 6D, if the thickness of the posts is greater than the thickness of PDMS layer 118, the posts will create holes 120 in the PDMS layer 118. These can be designed so as to provide the holes necessary for matching the alignment pins 110 and the fluid input and output ports 122 and 124.

Inlet and outlet ports 122 and 124 provide flow paths for the injection and removal of fluid to and from reservoirs 112 and 114, respectively. Inlet and outlet ports 122 and 124 are aligned with reservoirs 112 and 114, respectively, thereby allowing access to microchannel 116 even when microchannel 116 is covered by encapsulating membrane 118. Ports 122 and 124 then may serve to introduce fluid to and remove fluid from the microfluidic system in patterned structure 106. While ports 122 and 124 may alternatively be created using drilling techniques, the approach described herein creates posts 122 and 124 simultaneously with the alignment holes 120.

Four posts 110 of encapsulation membrane 118 align with holes 120 in encapsulating layer 118. Holes 120 may be formed in the same manner described above with regard to ports 122, 124. Encapsulating layer 118 simply 'drops' onto posts 108 when positioned correctly using surface tension, e.g., provided by drops of isopropanol. The alignment system created by the two-level SU-8 patterned structure 106 allows not only for simple channel encapsulation, but also for easy removal of encapsulating membrane 118. Removal of encapsulation membrane 118 allows a wafer of device 100 to be cleaned and reused after an experiment. Accordingly, components of device 100 can be recycled after cleaning, circumventing the need to spend a long time fabricating a separate MEMS device for each particular experiment. Encapsulating membrane 118 also is useful in preventing evaporation of aqueous solutions if maintained near atmospheric pressure so that pressure differentials between the encapsulated fluid and the outside are small.

The surface(s) of PDMS of encapsulation layer 118 can be oxidized by treatment with oxygen plasma. This creates —SiOH groups on the PDMS surface for adding other functional groups. Such oxidized PDMS is hydrophilic and easier to use for microfluidics, in comparison with the naturally hydrophobic character of PDMS. When brought into contact with glass, silicon, quartz, silicon nitride, polyethylene, polystyrene, glassy carbon, or even other oxidized PDMS, the oxidized PDMS can create an irreversible, covalent, siloxane bond, thereby permanently encapsulating the channel.

In the event that a removable membrane 118 is desired, covalent sealing techniques are not used, i.e., the PDMS is not oxidized. The strength of the seal provided by the surface energy of PDMS without covalent bonding is sufficient for most biological applications.

Figure 4:
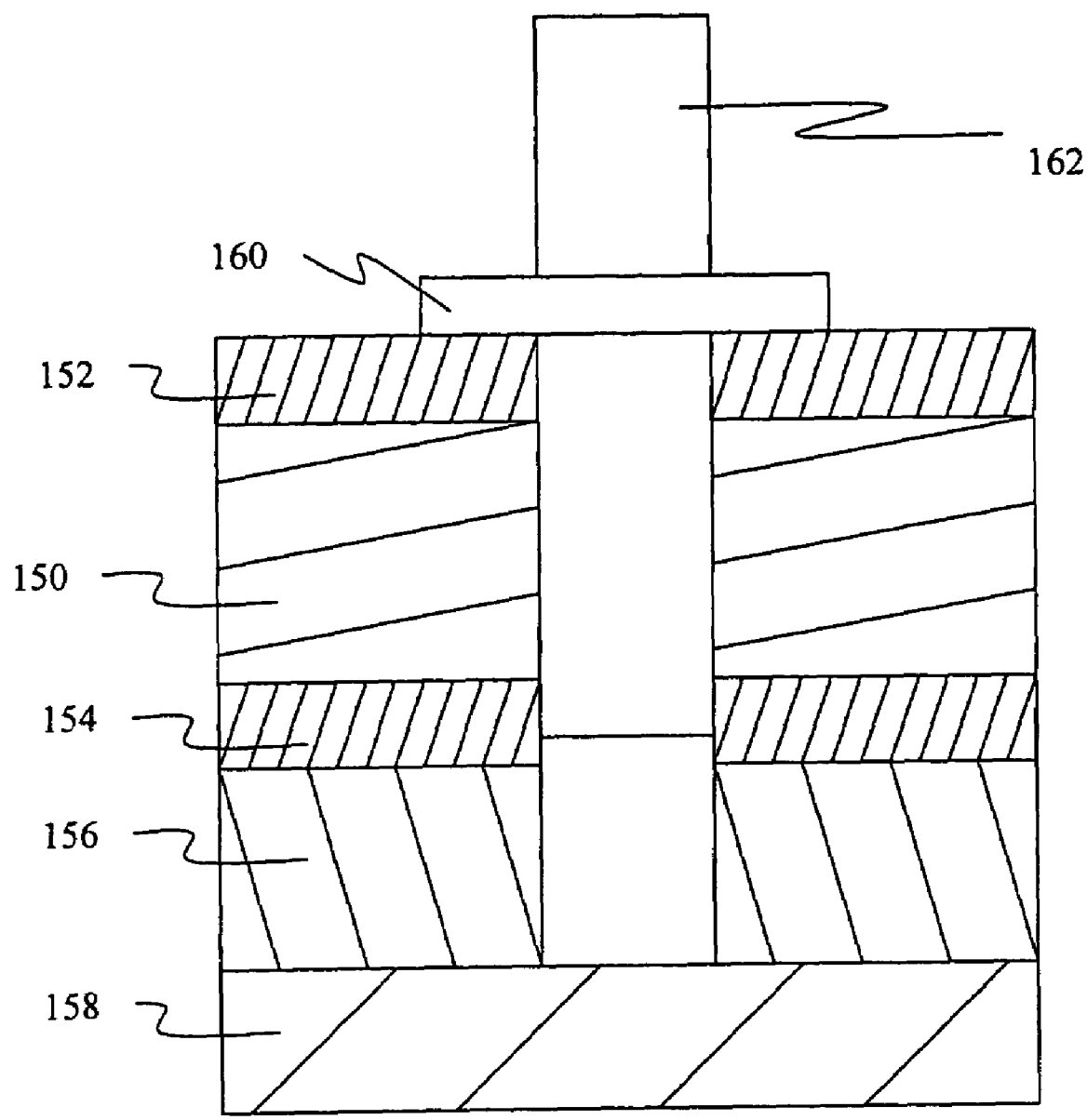
FIG. 4 is a cross-sectional view of a structure for carrying out a blister test.

The bond strength between patterned structure 106 and encapsulating layer 118 is important for proper sealing of device 100. In the event encapsulation is to be reversible, low bond strength is desired. Still, the encapsulation should be strong enough to prevent water leakage under normal operating conditions. An estimate of the bond strength between PDMS and SU-8 was made using the 'blister test'. A device suitable for carrying out the blister test is illustrated in FIG. 4. For this test, a tunnel was created in a silicon wafer 150, with thermal oxide (SiO2) layers 152 and 154 on both sides of wafer 150. Next, photoresist was spun on both SiO2 layers 152, 154. The backside resist layer was patterned and developed, followed by etching the oxide layer with buffered HF. The combination of resist and oxide was used as the mask for deep reactive ion etching circular holes in silicon substrate 150. Subsequently, a 10 µm thick SU-8 layer 156 was deposited and patterned on the membranes and other oxide areas to create holes in SU-8. The SiO2 membranes were etched away with reactive ion etching, leaving a cylindrical tunnel through the multilayer structure. Finally, PDMS layer 158 was prepared on SU-8 layer 156.

Using the test fixture of FIG. 4, pressure was applied on PDMS 158 covering by flowing nitrogen gas (N2) through a needle 162 into the tunnel. O-ring 160 was used to prevent the leaking of $N_2$. The pressure was increased from atmospheric pressure at a rate of 20 Torr/min until the PDMS was observed to peel off from the SU-8, creating a blister. The resulting surface energy was calculated using the formula:

$$\gamma = (0.088 P_f^2 a^4)/Et_w^3$$

in which Pf is the critical pressure for debonding; a is the radius of the hole; E is Young's modulus of PDMS ($7.5 \times 10^5$ Pa) and $t_w$ is the thickness of PDMS.

With a 70 µm thick PDMS cover on a hole of radius 300 µm, the critical pressure for debonding was found to be 30.7 Torr above atmospheric pressure. Thus, the surface energy was calculated to be $0.047$ $J/m^2 \pm 0.018$ $J/m^2$. This value is comparable with the values obtained for bonded hydrophilic silicon wafers. It is typical of surfaces bonded by Van der Waals forces in combination with weak chemical interactions (e.g., relatively weak hydrogen bonds). This surface energy is sufficient to prevent water leakage from the microfluidic channel of the device at the low pressures typically encountered during a biological experiment, yet sufficiently low to permit reversible removal and attachment of encapsulating membrane (PDMS) 118 to patterned structure (SU-8) 106.

Reactive Layer

MEMS device 100 is capable of using selective electrodeposition of a bio-polymer 126, such as chitosan, to successfully create an environment for complex biological experiments and biomolecular reactions within a microchannel composed of material such as SU-8 microchannel 1116. To accomplish such reactions a reactive layer 126 (FIG. 5) is fabricated on electrodes 104 (FIG. 1) present in the microfluidic channels. Such reactive layer is described herein.

Reactive layer 126 preferably comprises an organic polymer and/or organic oligomer, especially those capable of controlled solubilization and insolubilization, such as via pH adjustment. For the purpose of describing the invention hereinafter, but not necessarily by limitation, the reactive layer will be exemplified as polysaccharide mass which can be solubilized under appropriate conditions in a liquid medium, preferably aqueous, and which can be subsequently deposited on an electrode. Other examples of reactive layers include proteins, such as polylysine.

The reactive layer of embodiments of the present invention preferably comprises or is derived from a composition comprising polysaccharides. As used herein, the term polysaccharide includes starches and polysugars, particularly polymers containing glucosamine residues. Ionizable polysaccharides include carboxymethylcellulose, chitosan, chitosan sulfate, pectin, alginate, glycosaminoglycans, ionizable agar, and carrageen. Other synthetic polymers include, for example, polymethacrylic acid, ligninsulfonates, polyvinylsulfonic acid, polyvinylphosphonic acid and polyethyleneimine; similar extracts of plants also may be used. Other suitable polysaccharides include gums from trees, pectins from fruits, starches from vegetables, and celluloses from woody fibers. Chitosan is the preferred ionizable polysaccharide of the present invention.

In preferred embodiments, the selective insolubilization and solubilization of the polysaccharides of the present invention is accomplished by modifying one or more of the polysaccharide ionizable group(s), which may be the same or different. At one or more range(s) of pH the polysaccharide will be soluble in an aqueous solvent ("solubilizing pH ranges"), whereas at one or more other pH values range(s), the polysaccharide will be insoluble (or less soluble), and thus be capable of forming an insoluble mass (e.g., hydrogel and/or compact film) deposited on a support. Suitable ionizable groups include those ionizable at low pH, e.g., capable of forming a positive charge (e.g., alkyl amine groups, primary, secondary or tertiary amine groups, guanidinium groups, imidazole groups, indole groups, purine groups, pyrimidine groups, pyrrole groups, etc.) and those that are ionizable at high pH, e.g., capable of forming a negative charge (e.g., alkoxide groups, carboxyl groups, hydroxy acid groups, phenolic groups, phosphate groups, sulfhydryl groups, etc.). Suitable groups may exhibit multiple pKs, which may be the same (e.g., polyacidic or polybasic) or different (e.g., zwitterionic). For selectively insolubilizable polysaccharides that are ionizable at low pH, amine groups are preferred; for selectively insolubilizable polysaccharides that are ionizable at high pH, carboxyl groups are preferred.

Chemical deposition of the selectively insolubilizable polysaccharide is preferably electrode selective, providing another degree of control over the process. Polysaccharides containing a group ionizable at a low pH, e.g., capable of forming a positive charge, are attracted to and deposit on the negative electrode (i.e., the cathode). Accordingly, for such polysaccharides the electrically conductive support (electrode 104 in FIG. 1) is polarized to serve as the negative electrode. The shape of the electrically conductive electrode on which the polysaccharide deposits largely dictates the spatial distribution and localization of the deposited polysaccharide. Positively charged polysaccharides are neither attracted to nor deposit on the positive electrode. Examples of groups ionizable at a low pH include alkyl amine groups, primary, secondary or tertiary amine groups, guanidinium groups, imidazole groups, indole groups, purine groups, pyrimidine groups, pyrrole groups, etc.

In contrast, a polysaccharide containing a group ionizable at a high pH, e.g., capable of forming a negative charge (e.g., alkoxide groups, carboxyl groups, carboxylate groups, hydroxy acid groups, phenolic groups, phosphate groups, sulfhydryl groups, etc.) is attracted in its soluble state to the positive electrode (i.e., the anode) and deposits on the positive electrode, but not the negative electrode. Accordingly, the electrically conductive support will be polarized to serve as the positive electrode for polysaccharides containing groups ionizable at a high pH.

Various aspects of the electrochemical cell, reaction conditions, and process parameters may be manipulated to control the chemical deposition on the electrically conductive support and the resulting properties and traits of the deposited polysaccharide mass. The physical state of the mass may be, for example, that of a solid compacted film, a semi-solid hydrogel, or a physical state between a compacted film and a hydrogel. Generally, reaction conditions and process parameters that have the greatest influence on physical state are the current density, pH, and deposition time. Other process conditions that may also influence the physical state of the deposition include the applied voltage, total ion concentration, polysaccharide concentration, temperature, and the like. Generally, high current densities and pH's relatively near the solubility limit are preferred for formation of hydrogels.

A preferred selectively insolubilizable polysaccharide is pH-responsive, nucleophilic chitosan, which is an amine-rich polysaccharide derived by deacetylation of chitin. Chitin is the second most abundant polysaccharide in nature and is found in crustaceans, insects, and fungi. Chitosan is also commercially available, such as from various suppliers (e.g., Aldrich, Sigma). The term chitosan includes chitosan polymers and oligomers with complete or substantially complete deacetylation, or chitosan with less than complete deacetylation. Chitosan also includes various derivatives of chitosan having the necessary solubility for this invention and at least a portion of the amino functional groups available for reaction.

Chitosan is water-soluble at low pH. At higher pH (>6.3), the amino group becomes deprotonated and the polymer precipitates out of solution. Chitosan can therefore be deposited from an aqueous solution under mildly acidic conditions. If a negative charge is induced on an electrode, deposition has been shown to occur on that electrode. This is understood from recognizing that the electrolysis of water which occurs at the negative electrode creates a locally high pH condition compared to the low pH bath, and when the negative electrode attracts the positively charges chitosan species near to it, these species precipitate out onto the electrode in the locally high pH region (where the chitosan is insoluble). Thus, chitosan selectively electrodeposits on cathodes while deposition fails to occur on unpolarized or positively charged surfaces. From a processing standpoint, its pH-dependent solubility makes chitosan an attractive polymer to use in a MEMS device.

The chitosan solution used to deposit chitosan onto the support may have a chitosan content of, for example, about 0.0001 to about 0.001 weight percent (grams chitosan/grams solution), about 0.001 to about 0.01 weight percent, about 0.01 to about 0.1 weight percent, about 0.1 to about 1 weight percent, about 1 to about 10 weight percent, about 10 to about 20 weight percent, and about 20 to about 30 weight percent. These ranges are provided only by way of example, and are not limiting. The range selected is dependent upon factors such as the amount of chitosan deposition desired.

The operational electrical circuit may be controlled by using a controlled constant voltage, a controlled constant current, or a mixture of the two as the deposition proceeds. Using constant voltage there is typically a large current and high deposition rate until an initial chitosan deposit is achieved, after which the current is reduced by the series resistance of the chitosan. Using constant current, the initial voltage is typically small but then increases rather quickly to a nearly constant value as the resistive chitosan deposit develops on the surface. The tendency of the depositing chitosan to form a solid compact film is increased with use of a pH of about 5 to about 5.5, a relatively low current density, e.g., about 0.1 to about 10 A/m$^2$ (e.g., about 1 A/m$^2$ to about 5 A/m$^2$), and a relatively short deposition time, e.g., about 1 to about 10 minutes. For example, under typical conditions at a current density 2-5 A/m$^2$, the voltage rises within 1 min to slightly over 2 V and remains nearly constant over a total deposition time of 5 min. The deposition process is more reproducible and controllable for constant current mode of electrodeposition of chitosan.

The thickness of the deposited chitosan hydrogel may range, for example, from about 0.01 micron to about 3 microns, although thicknesses outside this range may be achieved. The chitosan solution concentration, the voltage, and the time a current is applied to deposit chitosan on a substrate can be varied to control thickness.

It is to be understood that although the first embodiment described and illustrated herein includes a reactive film, the invention in its broader aspects encompasses MEMS devices and methods without reactive films and their conjugated molecules (discussed below). For example, the MEMS device may be used to control flow of a fluid (i.e., a liquid and/or gas) free of a reactive layer or its precursor through a micro-channel, without performing deposition of a reactive layer in the micro-channel.

Conjugated Molecules

Chitosan, a biocompatible, biodegradable amino-polysaccharide biopolymer, creates an environment that is biologically inert and flexible for sensing and manipulating macromolecules and organisms within a MEMS device. The chitosan amine functional groups are chemically at a broad range of pH environments. The nucleophilic properties of the amine group allow it to conjugate, such as by covalent coupling, to other molecules, including proteins, oligonucleotides, and even cells.

In the context of MEMS device 100, chitosan reactive layer 126 is able to anchor molecules such as proteins, nucleic acids, and cells to electrodes 104 on the bottom of microchannel 116. A mild, non-disruptive reaction environment can be created using chitosan, preserving biological activities and selectivities. This ability to easily anchor proteins to the MEMS device allows it to be used for biosensing applications by studying antigen-antibody interactions. Further, by controlling electrode placement and activation, it is possible to selectively control the spatial positioning of chitosan reactive layer(s) 126 and the conjugated molecules. Further, deposition controls provide flexibility in assigning different roles to reactive layers 126. For example, selective deposition allows some electrodes to be designated as sensing electrodes that hold reactant and/or record electrical activity, whereas other electrodes that are free of reactants can act as actuating electrodes for flow control. By playing different roles, these polymers are integrated to create smart sensors and actuators for biological applications.

Examples of molecules that may be bonded to the exposed portions of reactive layer 126 include biomolecular and/or cellular species (eukaryotic or prokaryotic). Examples of biomolecular species include proteins (especially enzymes, receptors, receptor ligands, and antibodies), nucleic acid molecules (especially DNA and RNA), antigens, polysaccharides, drugs (e.g., opiates, cannabinoids, etc.), etc. Examples of cellular species include whole cells (e.g., such as cultured or primary human, non-human mammalian, insect, yeast, fungal or other eukaryotic cells, or bacterial cells) or sub-cellular components thereof, viruses or sub-viral components thereof. As used herein, the terms sub-cellular and sub-viral components are intended to refer to membrane-associated proteins (especially enzymes, receptors, and receptor ligands), membrane-associated antigens, organelles, etc. The binding of such biomolecular and/or cellular species is particularly amenable for use in microfluidic systems. The reactive layer (e.g., polysaccharide mass) of the present invention may be modified to facilitate its ability to stably conjugate with other molecules. Additionally or alternatively, the other molecules may be modified to facilitate their ability to stably conjugate with the reactive layer (e.g., the polysaccharide mass).

Such modifications may include covalent cross-linking agents (e.g., dialdehydes (such as glutaldehyde, formaldehyde, glyoxal, etc.), anhydrides (such as succinimide, carbodiimide, dicyclohexylcarbodiimide, etc.), genipin, amino acids, etc.) or non-covalent crosslinking agents (such as tripolyphosphate (TPP), etc.). Such molecules may be non-specifically divalent or multivalent, possessing two or more identical reactive groups that can be used to conjugate the polysaccharides of the reactive layer to other molecules (e.g., glutaraldehyde, lysine, arginine, glutamate, aspartate, polysaccharides, etc.) so as to provide "spacer" molecules that can address and diminish potential issues of steric interference. Alternatively, such molecules may comprise two or more different relevant reactive groups such that an orthogonal synthetic approach may be employed. Examples of such compounds include amino acids. The carboxyl group of such compounds can be conjugated to the amine group of, for example, chitosan, to yield a free, and more sterically accessible, amino group that can be conjugated to the carboxy group of a glutamate or aspartate residue of a protein. Likewise, the reactive layers of the present invention can be modified to contain chloromethylbenzyl or trialkylsulfoniumbenzyl groups that can then react with the carboxyl group of other molecules.

Modifications may optionally be conducted enzymatically. Any of a variety of enzymes may be used for this purpose. Such enzymes may be used to activate a chemical group of a protein or other ligand so as to facilitate its reaction with a chemical group of the reactive layer. For example, without wishing to be bound by theory, it is believed that such enzymes activate phenols (such as tyrosyl residues of proteins, such as green fluorescent protein (GFP)) to convert the phenols to quinones. The activated quinones can then react with nucleophilic substituents, such as nucleophilic substituents of chitosan. Such enzymes are readily available commercially, and are ubiquitous in natural sources. For example, tyrosinase enzymes, phenol oxidases, and polyphenol oxidases (also peroxidase enzymes and probably laccase enzymes) may be employed to react with the tyrosine residues of a protein so as to facilitate the covalent bonding of the tyrosine phenolic oxygen to an amine group of chitosan.

The specific activity of the enzyme used will determine how much of the enzyme should be added. As an illustration, for a mushroom tyrosinase enzyme, a convenient level is from about 1 to about 200 U/mL, preferably about 20 to about 100 U/mL, and most preferably about 60 U/mL. Higher amounts of enzyme content may result in depletion of the phenolic compound or molecular oxygen in the solution. The reaction is then allowed to proceed, conveniently with stirring overnight.

Owing to the flexibility of the chemistry involved, any of a wide variety of different compounds can be conjugated to the polymer. Such compounds particularly include proteins (especially enzymes, receptors, receptor ligands, or antibodies) and nucleic acid molecules (especially DNA or RNA).

For example, chitosan possesses amino groups that confer nucleophilic properties to the polymer. Specifically, the deprotonated amino groups have an unshared electron pair that can undergo reaction with a variety of electrophiles. As a result, various chemistries can be exploited to crosslink chitosan and to graft (or conjugate) substituents onto the polymer. The substituent may be coupled to the chitosan before and/or after the chitosan has been deposited onto the substrate. The substituent may comprise various molecules, such as labile biomolecules. Such biomolecules include, not necessarily by limitation, bound proteins, enzymes, polynucleotides, RNA, DNA, cells, and the like. The molecules are assembled on the polysaccharide template, which acts as an interface between the molecules and the inorganic substrate.

In one embodiment, the conjugated molecules of such surfaces or matrices will comprise one, two, three or more enzyme species. Significantly, by incubating such surfaces or matrices in contact with a fluidic layer (i.e., a surface or matrix that contains a flowing or flowable liquid or gas capable of transporting other molecules (e.g., nucleic acid molecules, proteins, enzymatic substrates and/or products, etc.)), multiple stepwise synthetic reactions can be made to occur, either sequentially or in parallel. Suitable enzyme species include: aminopeptidases, angiotensin converting enzymes, caspases, cathepsins, cholinesterases, collagenases, deaminases, endonucleases, endopeptidases, esterases, exonucleases, lipases, nucleotidases, phosphatases, proteases, restriction endonucleases, etc.

In another embodiment, the conjugated molecules of such surfaces or matrices will comprise one, two, three or more antibody species. As used herein, the term "antibodies" is intended to encompass not only conventional immunoglobulins, but also single chain antibodies, humanized antibodies, monoclonal antibodies etc. Significantly, by incubating such surfaces or matrices in contact with a fluidic layer containing antigens, multiple immunoassays can be simultaneously or sequentially conducted. Any of a wide variety of assay formats may be used in accordance with the methods of the present invention. They may be heterogeneous or homogeneous, and they may be sequential or simultaneous. They may be competitive or non-competitive. U.S. Pat. Nos. 5,563,036; 5,627,080; 5,633,141; 5,679,525; 5,691,147; 5,698,411; 5,747,352; 5,811,526; 5,851,778 and 5,976,822 illustrate several different assay formats and applications.

In another embodiment, the conjugated molecules of such surfaces or matrices will comprise one, two, three or more bound receptor molecule species or bound ligands of receptor molecules. Significantly, by incubating such surfaces or matrices in contact with a biological sample, multiple receptor/receptor ligand binding assays can be simultaneously or sequentially conducted. Suitable receptor species include: 5-hydroxytryptamine receptors, acetylcholine receptors, adenosine receptors, adrenoceptor receptors, adrenomedullin receptors, amylin receptors, amyloidreceptors, angiotensin receptors, atrial natriuretic peptide (ANP) receptors, bombesin receptors, bradykinin receptors, calcium-channel receptors, cannabinoid receptors, cgrp receptors, chemokine receptors, cholecystokinin and gastrin (CCK) receptors, corticotropin releasing factor (CRF) receptors, dopamine receptors, endothelin receptors, excitatory amino acid receptors, gaba receptors, galanin receptors, gastric inhibitory peptide (GIP) receptors, GDNF receptors, glucagon receptors, glucagon-like peptide receptors, glycoprotein hormones receptors, growth hormone secretagogue receptors, GTP-binding-protein receptors, hemotopoietin receptors, histamine receptors, imidazole receptors, integrin receptors, interleukin-1 receptors, melanin-concentrating hormone receptors, melanocortin receptors, melatonin receptors, metastin receptors, motilin receptors, neuromedin receptors, neuropeptide FF receptors, neuropeptide Y receptors, neurotensin receptors, opioid receptors, orexin receptors, P2 purinoceptor receptors, parathyroid hormone (PTH) receptors, phosphodiesterase enzyme, platelet activating factor (PAF) receptors, potassium-channel receptors, prolactin receptors, prostanoid receptors, retinoid receptors, selectin receptors, somatostatin receptors, steroid receptors, tachykinin receptors, tumour necrosis factor (TNF) receptors, tyrosine kinase receptors, urotensin II receptors, vasoactive intestinal peptide (VIP) receptors, vasopressin receptors, etc.

In another embodiment, the conjugated molecules of such surfaces or matrices will comprise one, two, three or more bound nucleic acid molecule species, which may be DNA or RNA or be composed of non-naturally occurring residues (e.g., PNA). Such nucleic acid molecules may have defined sequences (such as the sequences of genes or fragments thereof), or may be composed of random or pseudorandom oligonucleotides (i.e., nucleic acid molecules of 3-100 nucleotides in length) or polynucleotides (i.e, nucleic acid molecules greater than 100 nucleotides in length). Significantly, by incubating such surfaces or matrices in contact with a biological sample (or an extract thereof), multiple hybridization reactions involving nucleic acid molecules present in the sample can be simultaneously or sequentially conducted. Such hybridization reactions can be used in concert with nucleic acid amplification strategies (such as the polymerase chain reaction (PCR) (e.g., U.S. Pat. Nos. 4,683,202; 4,582,788; 4,683,194, 6,642,000, etc.)); ligase chain reaction (LCR), self-sustained sequence replication (3SR) (e.g., Guatelli et al., Proc. Natl. Acad. Sci. USA 87:1874-1878 (1990); PCT Publication. WO 88/10315), nucleic acid sequence based amplification (NASBA) (e.g., Kievits, J Virol Methods. 35:273-86 (1991)), strand displacement amplification (SDA) (e.g., U.S. Pat. No. 5,270,184), and amplification with Qβ replicase (Birkenmeyer et al., J. Virological Methods, 35:117-126 (1991); Landegren, Trends Genetics, 9:199-202 (1993); and rolling circle amplification (e.g., U.S. Pat. Nos. 5,854,033; 6,183,960; 5,354,668; 5,733,733)) to accomplish the amplification of the hybridized molecules, or their complements. The present invention permits hundreds, thousands, and tens of thousands of nucleic acid species to be deposited on to such surfaces or matrices.

Additionally, such hybridization reactions may be used to sequence the nucleic acid molecules present in the sample, or to assess the expression profile of the genes of cells present in the biological sample (or an extract thereof) (see, e.g., U.S. Pat. Nos. 6,632,606; 5,002,867; 5,202,231; 5,888,819; Lipshutz et al., Biotechniques, 9 (3):442-447 (1995) and Chee et al., Science, 274:610-614 (1996); DeRisi, J. et al. (1996) "USE OF A cDNA MICROARRAY TO ANALYSE GENE EXPRESSION PATTERNS IN HUMAN CANCER" *Nature Genetics* 14:457-60; Luo, L. et al. (1999) "GENE EXPRESSION PROFILES OF LASER-CAPTURED ADJACENT NEURONAL SUBTYPES" *Nature Medicine* 5:117-22; Bonner, R. F. et al. (1997) "LASER CAPTURE MICRODISSECTION: MOLECULAR ANALYSIS OF TISSUE" *Science* 278:1481, 1483; Schena, M. et al. (1995) "QUANTITATIVE MONITORING OF GENE EXPRESSION PATTERNS WITH A COMPLEMENTARY DNA MICROARRAY" *Science* 270:467-70).

In another embodiment, the conjugated molecules of such surfaces or matrices will comprise one, two, three or more non-ionizable polysaccharides or other polymer molecules. Thus, for example, the present invention permits one to accomplish the spatial and/or temporal selective deposition of polymers such as: aramids, celluloses, kevlars, nomex, nylons, poly(ether sulfone)s, poly(methyl methacrylate)s, poly(phenylene oxide)s, poly(phenylene sulfide)s, poly(vinyl acetate)s, poly(vinyl chloride)s, poly(vinyl) fluorides, poly(vinylidene chloride)s, poly(vinylidene fluoride)s, polyacrylonitriles, polybutadienes, polycarbonates, polychloroprene, polycyanoacrylates, polydicyclopentadienes, polyesters, polyethylenes, polyimides, polyisobutylenes, polyketones, polypropylenes, polystyrenes, polytetrafluoroethylenes, polyurethanes, polyvinylpyrrolidones, rayons, silicones, starches, etc.

System Fabrication

Figure 5A:
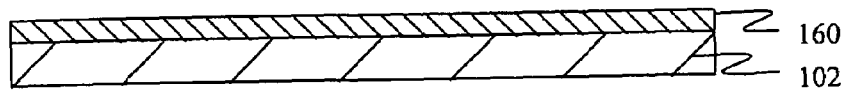
FIGS. 5A through 5H are cross-sectional views of the micro-electro-mechanical system (MEMS) device of the first embodiment during consecutive stages a fabrication process.
Figure 5B:
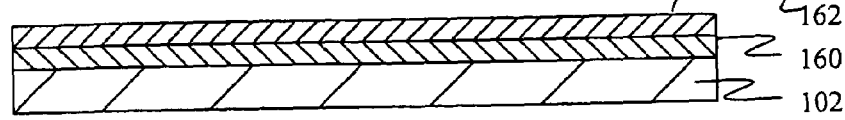

The method used for the fabrication of MEMS device 100 is shown in detail in FIGS. 5A to 5H and 6A to 6D. Referring to FIG. 5A, a chromium adhesion layer 160 was deposited on silicon substrate 102 coated with a 1 micron thick thermal $SiO_2$ layer. Chromium was deposited using e-beam evaporation to a thickness of 90 Å. Gold was evaporated immediately afterward to form a gold layer 162 having a thickness of 2000 Å, as shown in FIG. 5B.

Figure 5C:
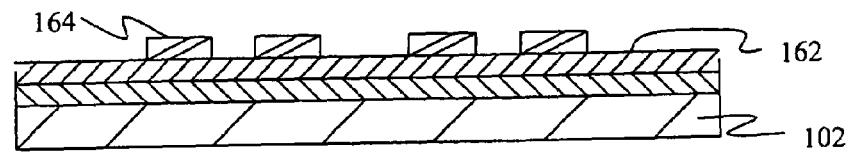
Figure 5D:
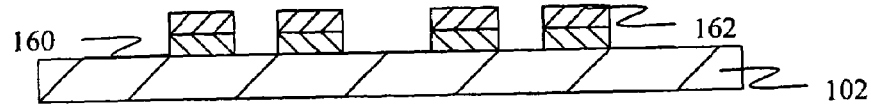
Figure 5E:
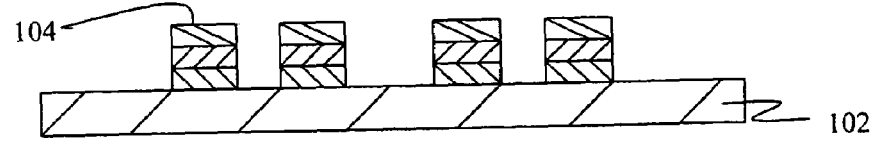

Chromium adhesion layer 160 and gold layer 162 were patterned using photolithography. A photoresist 164 (Shipley 1813) was applied on the gold layer 162 via conventional spin-coating techniques. A mask was placed over photoresist 164, and photoresist 164 was then patterned, for example, by exposure of the unmasked portions of photoresist 164 to UV light (FIG. 5C). The exposed, non-masked areas were then etched with a suitable wet chemical etchant to develop metals 160 and 162 and photoresist 164 into a pattern, and photoresist 164 then was removed, leaving patterned sputtered metals 160, 162 over substrate 102, as shown in FIG. 5D.

Silicon substrate 102 with metals 160 and 162 was then cleaned with piranha solution (3:1 ratio of H2SO4:H2O2) as a preparation for polypyrrole (PPy) deposition. Polypyrrole was then deposited electrochemically from an aqueous solution of 0.1 M pyrrole and 0.1 M sodium dodecyl benzene sulphonate (NaDBS). A constant potential of 0.55 V (versus Ag/AgCl) was applied until a PPy thickness of approximately 1-3 μm is reached. The PPy layer is represented by reference numeral 104 in FIG. 5E. Although gold is shown as a base layer for PPy electrodeposition, it is possible to pattern self-assembled conducting polymer bi-layers on bare silicon, thus circumventing the use of gold.

Figure 5F:
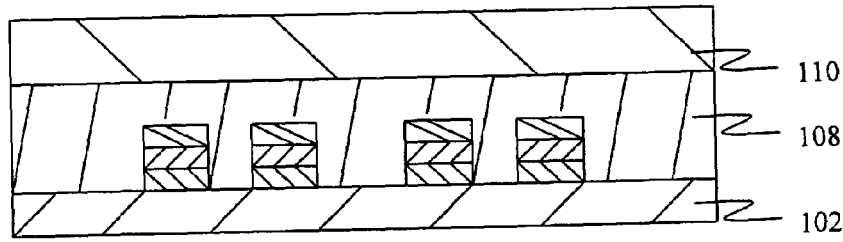
Figure 5G:
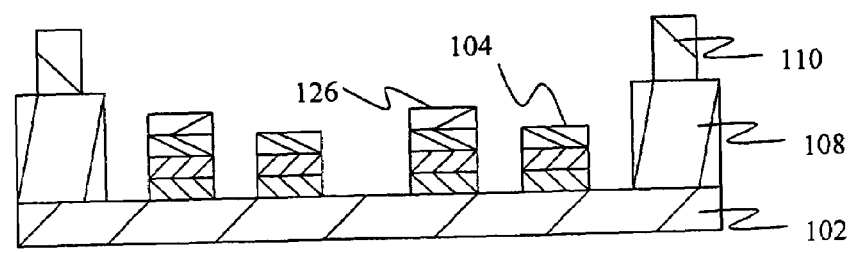

Microfluidic channel 116 containing polypyrrole electrodes 104 then was constructed using soft lithographic techniques. As shown in FIGS. 5F and 5G, first layer 108 of SU-8 structure 106 was spun to a thickness of 100 μm, baked, and exposed to create the reservoirs and channels. A second, 100 μm thick layer 110 of SU-8 was spun on top of first layer 108. The post-bake step for first layer 108 served as the pre-bake for the second layer 110. Second layer 110 was then exposed to create alignment posts 110 for PDMS encapsulation membrane 118. After baking and development, a clear, a two-layer SU-8 structure comprising patterned layer 108 and posts 110 was provided, with microchannel 116 located between walls of patterned layer 108.

The SU-8 substrate preparation process preferably comprises two baking steps. First, a pre-exposure bake helps to eliminate excess solvent from the photoresist matrix, increasing the resolution attainable with the negative photoresist. The post-exposure bake helps to complete the cross-linkage of the SU-8 chains, further solidifying the resulting structures. SU-8 also has a high coefficient of thermal expansion, allowing excess heat to crack the cross-linked structure. This presents a problem for bi-layer SU-8 structures because baking required for second layer 110 can crack first layer 108. To combat this problem, the post-exposure bake for first layer 108 is used as a pre-exposure bake for second layer 110. This reduces the total heat absorbed by first layer 108 and results in less cracking in the final structure.

To demonstrate the abilities of this embodiment of the invention, green fluorescent protein (GFP) was conjugated to the electrodeposited chitosan. GFP is a convenient model because the intact protein can be readily visualized under UV illumination. Prepared by well-established bioengineering methods, GFP was expressed in *E. coli* BL21 (Invitrogen) using a pTrcHisB (Invitrogen) expression vector. Cells were grown under standard fermentation conditions and the fusion protein was purified using immobilized metal affinity chromatography.

Glutaraldehyde was used to anchor the model protein, GFP, onto the selectively deposited chitosan on the PPy electrodes. Glutaraldehyde is a homo-bifunctional coupling agent that reacts with amines and is commonly used for coupling biopolymers (e.g. proteins and nucleic acids). In previous work, amine-terminated oligonucleotide probes were coupled to the glutaraldehyde-activated chitosan surface. This approach can be used to create biosensors based on nucleic acids. Glutaraldehdye can also be used to couple proteins to chitosan, although proteins are considerably more labile than nucleic acids.

After chitosan was selectively deposited, the wafer was immersed in glutaraldehyde solution (0.05%) for 30 minutes. After glutaraldehyde activation, the wafer was extensively washed with 0.1 M PBS (Dulbecco's Phosphate Buffered Saline, Sigma-Aldrich Chemicals) buffer and then immersed in a GFP solution ($\approx$0.4 μg/ml) for 30 minutes. Two control experiments were performed at the same time. One control was a wafer with devices that lacked chitosan. The second control was a wafer in which chitosan was deposited onto the channel's electrodes, but the deposited chitosan was not activated with glutaraldehyde. Both controls were immersed in GFP solution for 30 minutes. All samples were extensively washed with PBS buffer before examination.

The bio-functionalized microfluidic channels were examined using a fluorescence stereomicroscope (MZFLIII, Leica) with a fluorescence filter set (GFP Plus) using an excitation filter at 480 nm (band width of 40 nm) and an emission barrier filter at 510 nm. Photomicrographs were prepared from the fluorescence microscope using a digital camera (Spot 32, Diagnostic Instruments).

After SU-8 processing, biopolymer (e.g., chitosan or a fluorescently-labeled chitosan derivative) layer 126 was electrodeposited (FIG. 5G) on selected polypyrrole electrodes 104 from a 0.6 weight percent solution with an applied current density of 1-2 A/m2 for 15 minutes. In this step, the wafer coated with polypyrrole was immersed in solutions containing either fluorescently-labeled chitosan or unlabeled chitosan. Two sets of electrodes were placed alternatingly in each device channel. 'Electrode set 1' was polarized to serve as the cathode while 'Electrode set 2' was not polarized. Therefore, selective deposition of chitosan could be realized. The anode used for the electrodeposition was an unpatterned silicon wafer coated with 90 Å thick Cr and 2000 Å thick Au. Both the anode and cathode were connected to a potentiostat (model 363 PerkinElmer Instruments) with alligator clamps. When chitosan deposition was finished, the device was washed with DI water and dried. A solution of NaOH (1 M) was used to neutralize chitosan for 30 minutes. In one device, fluorescently-labeled chitosan was prepared and used to visualize chitosan deposition. In a separate device, unlabeled chitosan was activated with glutaraldehyde for subsequent coupling with GFP. A fluorescent microscope was used for visualization of both the fluorescently-labeled chitosan and the chitosan film with the tethered GFP. Film thickness was measured to be 1.03 μm±0.05 μm.

Encapsulation membrane 118 (FIGS. 1 and 5) comprising PDMS was made on a separate silicon wafer as shown in FIGS. 6A to 6D. A layer 172 of 100 μm thick SU-8 was first patterned on a silicon master 170 to act as the mold for PDMS. Some of the SU-8 structures on this mold corresponded to alignment posts 110 of device 100, creating holes 120 in encapsulation membrane 118 synthesized on silicon master 170. Posts 110 are situated on silicon master 170 in positions corresponding to the respective locations of posts 110. Although not shown, silicon master 170 may be provided with additional posts for creating ports 122 and 124 in encapsulation membrane 118 synthesized on silicon master 170. These additional posts are situated on silicon master 170 in positions corresponding to the respective locations of reservoirs 112 and 114, thereby creating openings 122 and 124 in the PDMS encapsulation membrane 118 for injection of fluids (via opening 122) into reservoir 112 and for removal of fluids (via opening 124) from reservoir 114.

Figure 5H:
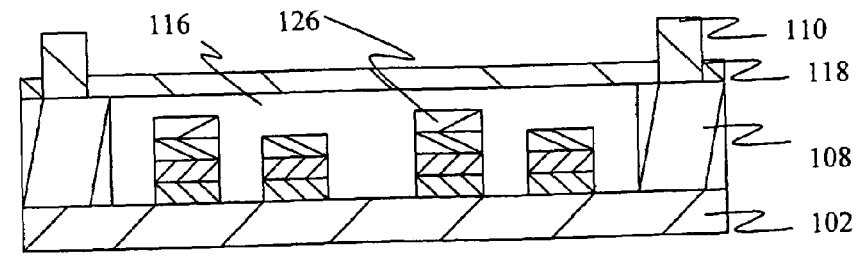
Figure 6A:
FIGS. 6A through 6D are cross-sectional views of an assembly for fabricating a component of the micro-electro-mechanical system (MEMS) device of the first embodiment.
Figure 6B:
Figure 6C:
Figure 6D:
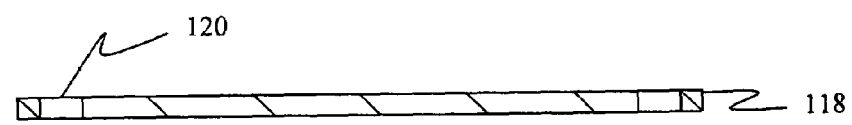

The SU-8 template wafer was then washed with a 0.1 M solution of sodium dodecyl sulfate (SDS) and allowed to dry. Next, PDMS (Sylgard 184) was mixed in a 10:1 ratio with its curing agent. It was then poured onto the wafer and spun to a thickness of 70 μm, less than the height of the posts 172. After curing in a box furnace at 65° C. for 2 hours, PDMS encapsulation membrane 118 was then peeled from the master 170, giving a cover for microchannel 116. The PDMS cover was aligned onto the device using surface tension provided by drops of isopropanol. The alcohol was allowed to evaporate causing the PDMS to rest on the device. As shown in FIG. 5H, holes 120 in PDMS encapsulation membrane 118 aligned to posts 110 of second SU-8 layer 108, allowing PDMS encapsulation membrane 118 to rest on first layer 108 of SU-8 patterned structure 106 and enclose microchannel 116.

Second Embodiment

Figure 7:
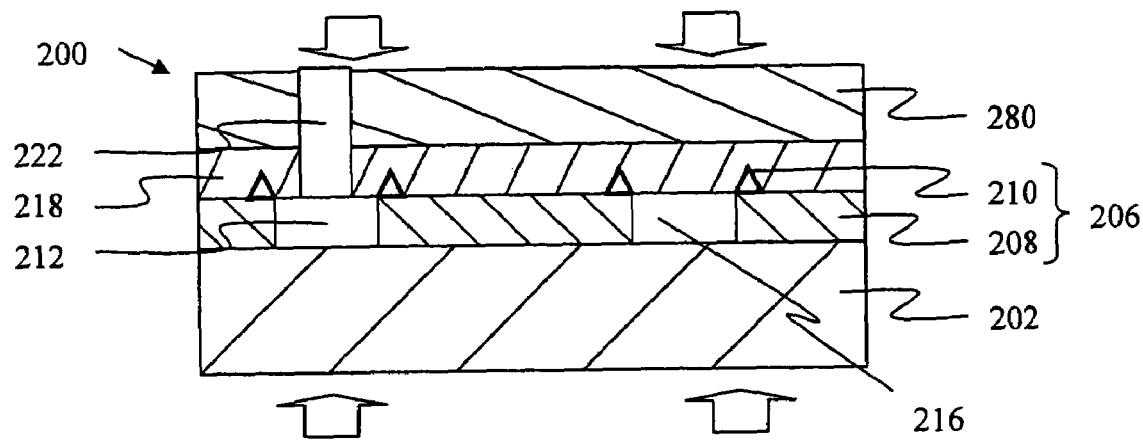
FIG. 7 is a cross-sectional view of a micro-electro-mechanical system (MEMS) device according to a second embodiment of the invention.

A micro-electro-mechanical system (MEMS) device 200 according to a second embodiment of the invention is illustrated in FIG. 7. Device 200 comprises a substrate 202 having an upper surface with a plurality of electrodes (not shown). Substrate 202 and electrodes may comprise like materials and characteristics and may serve like functions as substrate 102 and electrodes 104 described above in the first embodiment. Optionally, substrate 202 may be PYREX.

A patterned structure 206 is situated on substrate 202. Patterned structure 206 may comprise like materials (e.g., SU-8) and characteristics and may serve like functions as patterned structure 106 described above. Patterned structure 206 comprises a patterned layer 208 and a ridge (or "microknife edge") 210. Patterned layer 208 defines a microchannel 216 aligned with at least one of the electrodes. Patterned layer 208 further defines an inlet/outlet reservoir 212. Ridge 210 is situated on the upper surface of patterned layer 208, and extends continuously around the peripheries of microchannel 216 and any related microfluidic structures (e.g., input/output reservoir 212) of the microfluidic circuit to form a continuous boundary.

Ridge 210 may be created with a rectangular cross-section as readily accomplished by conventional SU-8 lithographic processing. Alternatively, gray-scale lithography may be employed to tailor the vertical profile (3-D shape) of narrow ridge 210, i.e., micro knife edge, and thereby to optimize the efficacy and reliability of the seal. Gray scale lithography allows a rounded top to micro knife edge 210, or a sharper, roughly triangular top, where strongest contact with the flexible sealing layer occurs. Gray scale lithography is discussed in detail in B. Morgan, et al., "*Compensated aspect ratio dependent etching (CARDE) using gray-scale technology,*" Microelectronic Eng'g 77, 85-94 (2005), and C. Waits, "*Investigation of gray-scale technology for large area 3D silicon MEMS structures*", J. Micromech. Microeng. 13, 170-177 (2003), the complete disclosures of which are incorporated herein by reference.

Generally, gray-scale lithography is a one-level process enabling the development of a pattern having gradient height profiles in a photoresist-masking layer. The photoresist is then used as a nested mask in dry anisotropic etching where the structure is transferred, typically into a silicon substrate, to a specified depth corresponding to the height of the desired final structure.

A reactive layer (not shown in FIG. 7) is deposited over the first electrode in microchannel 216. The reactive layer of the second embodiment may comprise the same materials (e.g., chitosan) and is capable of conjugation to the same molecules as described above in connection with the first embodiment.

A compressible sealing layer 218 is situated over patterned structure 206 to cover microchannel 216. Sealing layer 218 may be made of the same materials (e.g., PDMS) and may be made using the same methods as described above in connection with membrane 118. An upper substrate layer 280 optionally is situated over sealing layer 218. Upper substrate layer 280 preferably is transparent, and may be made of, for example, a plexiglass wafer. Sealing layer 218 and upper substrate layer 280 have aligned input/output port 222 for permitting the introduction of fluid to and/or removal of fluid from reservoir 212.

A compressive force is shown applied to the upper surface of upper substrate layer 280 and the lower surface of lower substrate 202. When MEMS device 200 is placed under compression, sealing layer 218 is compressed against patterned structure 206, causing ridge 210 to apply stress to and deform sealing layer 218 at contact areas along ridge 210. The applied compressive force is preferably substantially uniform and sufficient to establish a substantially leak-tight seal around the periphery of microchannel 216 and any related microfluidic circuit structures, i.e., along the path of the ridge 210. Advantageously, the leak-tight seal is established without requiring the use of adhesives or elevated temperatures. Furthermore, it allows removal of sealing layer 218 for reuse or analysis of the microfluidic system.

It is to be understood that although the second embodiment has been described herein as including electrodes and a reactive layer, the invention in its broader aspects encompasses MEMS devices and methods without electrodes and/or reactive layers, which may be omitted from the second embodiment. For example, the MEMS device may be used to control flow of a fluid (i.e., a liquid and/or gas) through a micro-channel, without performing deposition of a reactive layer over an electrode in the micro-channel.

Third Embodiment

Figure 8:
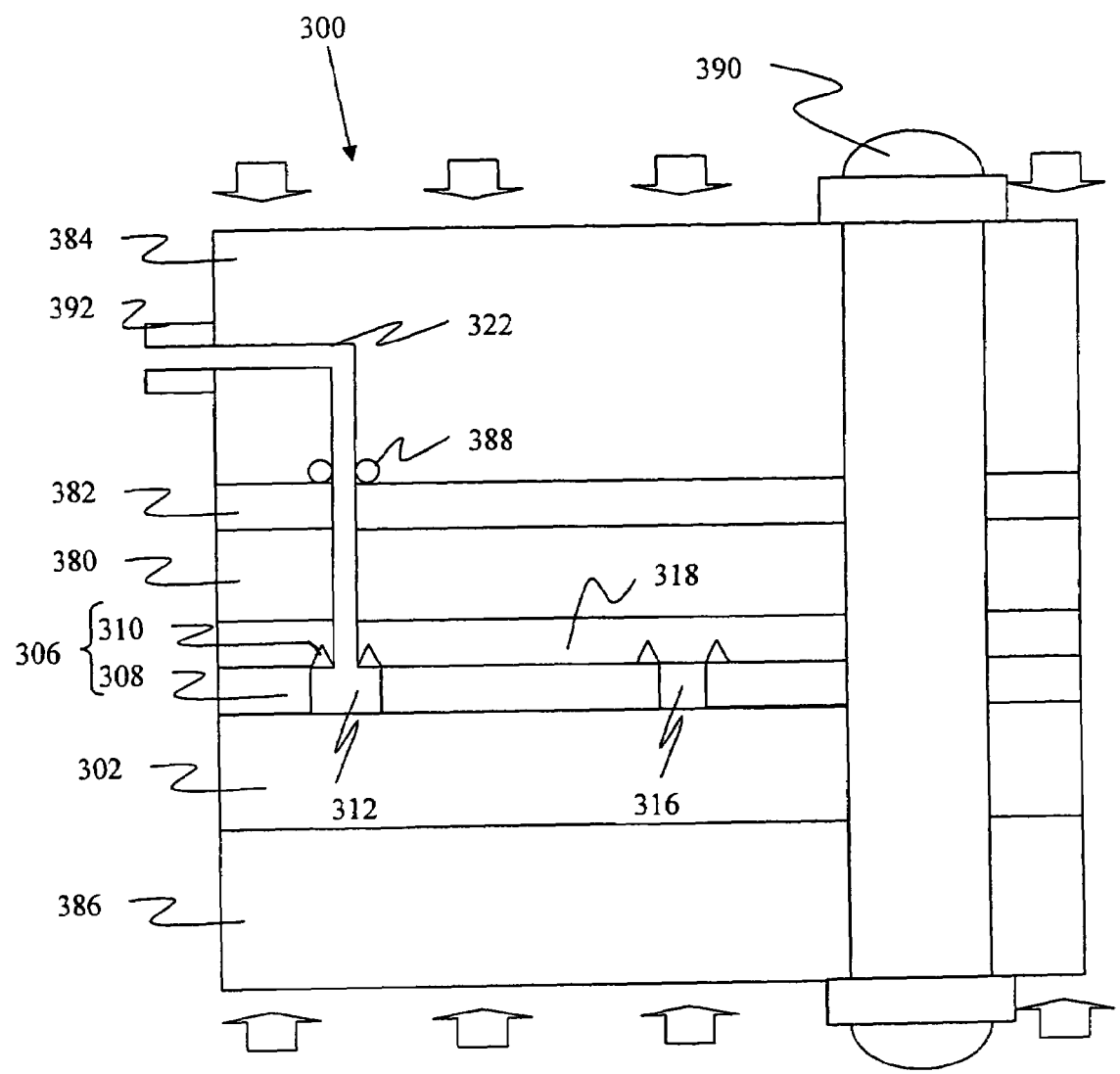
FIG. 8 is a cross-sectional view of a micro-electro-mechanical system (MEMS) device according to a third embodiment of the invention.

A third embodiment of the invention is illustrated in FIG. 8. Generally, the materials, structures and functions of components 302, 306, 308, 310, 312, 316, 318, and 322 are the same components 202, 206, 208, 210, 212, 216, 218, and 222, respectively. In the interest of brevity, their descriptions are incorporated by reference and will not be repeated.

A reactive layer (not shown in FIG. 8) is deposited over the first electrode in microchannel 316. The reactive layer of the third embodiment may comprise the same materials (e.g., chitosan) and is capable of conjugation to the same molecules as described above in connection with the first embodiment.

Positioned below substrate 302 is a base frame 386 (e.g., polycarbonate). Situated on top of sealing layer 318 are, in order from lowest to highest, upper substrate layer 380 (e.g., PLEXIGLASS), gasket layer (e.g., PDMS) 382, and a cover frame 384 (e.g., polycarbonate). O-ring seal 388 is positioned along port 322 between gasket layer 382 and cover frame 384. Reference numeral 392 represents an input/output port connector flange for fluid transport. Port connector flange 392 may be coupled to, e.g., a valve pump. A clamp mechanism 390 maintains the package under compressive force, shown by the arrows in FIG. 8. In illustrated embodiment, clamp mechanism 390 comprises a bolt having tightening flange portions over cover frame 384 and under base frame 386. Preferably, multiple clamp mechanisms 390 are used to uniformly distribute the clamping force.

Although not shown, gasket layer 382 optionally may be placed under further compression as follows. Threaded holes are drilled through cover frame 384, and screws are placed in the threaded holes and adjusted to further force and deflect cover frame 384 toward upper substrate layer 380. This makes it possible to tailor the stress distribution across the wafer and to improve the sealing at micro knife edge structure 310.

Base 386 may include a depression or other alignment device for reproducibly locating substrate 302 and the bioMEMS network (e.g., reservoir 312, channel 316) situated on the top of substrate 302. Using the polymeric bioMEMS designs described above, the bioMEMS circuit provides for fluidic and electrical inputs and outputs on the top of substrate 302, with fluidic seals to be completed when the sealing layer 318 (e.g., PDMS) is compressed, without or with micro knife edge structure 310 in FIG. 8 or 210 in FIG. 7.

Sealing layer 318, gasket layer 382, and cover frame 384 collectively define input/output port 322. Although only a single port is illustrated in FIG. 8, it is understood that device 300 may comprise additional ports. Further, certain ports may be designated for input, and others for output. Port 322 and other ports are arranged at positions matching the input/output reservoirs, e.g., 312, specified in the bioMEMS mask designs. Once the frames are bolted together using clamp mechanism 390 so that flexible sealing layer 318 and gasket layer 382 are compressed, the microfluidic inputs/outputs in the top frame connect to the bioMEMS microfluidics network to form a leak-tight seal for the wafer-and-package fluidic circuit. In addition, an array of electrical leads into the top of cover frame 384 are connected to spring-loaded conducting (metal) contacts at the bottom surface of cover frame 384, and in turn these penetrate through holes in PDMS gasket 382 to contact the exposed electrical contacts on the bioMEMS wafer, typically located on the surface of substrate 302 where wide openings in microfluidics layer 306 are present. The packaging-level arrays of fluidic and electrical connections emerging from the sides and/or top of the cover frame 384 can then be held together as an input/output umbilical, which is in turn connected to a control system for testing and operation of the microfluidic bioMEMS wafer. Optical interconnects can be incorporated in a similar fashion.

It is to be understood that although the third embodiment has been described herein as including electrodes and a reactive layer, the invention in its broader aspects encompasses MEMS devices and methods without electrodes and/or reactive layers, which may be omitted from the third embodiment. For example, the MEMS device may be used to control flow of a fluid (i.e., a liquid and/or gas) through a micro-channel, without performing deposition of a reactive layer over an electrode in the micro-channel.

Fourth Embodiment

Figure 9:
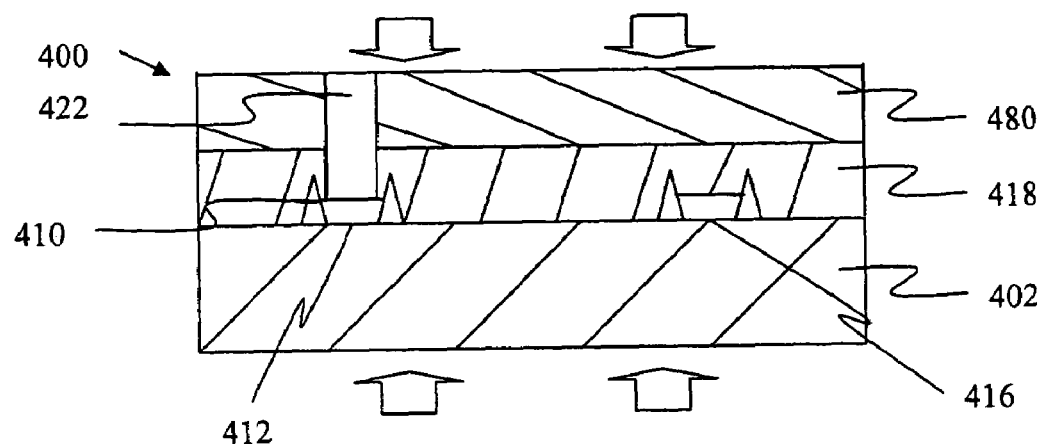
FIG. 9 is a cross-sectional view of a micro-electro-mechanical system (MEMS) device according to a fourth embodiment of the invention.

A micro-electro-mechanical system (MEMS) device 400 according to a fourth embodiment of the invention is illustrated in FIG. 9. MEMS device 400 comprises a substrate 402 having an upper surface with a plurality of electrodes (not shown). Substrate 402 and electrodes may be the same as substrate 102 and electrodes 104 described above in the first embodiment. Optionally, substrate 402 may be PYREX.

A patterned ridge structure 416 is situated on substrate 402. The materials (e.g., SU-8) described above in connection with patterned structure 106 may be applied to patterned ridge structure (or "micro-knife edge") 416. Notably, unlike patterned structure 206, structure 416 does not comprise a patterned layer (208 in FIG. 7) deposited over the entirety of substrate 402. Instead, patterned ridge structure 416 in FIG. 9 is deposited on substrate 406. Patterned ridge structure 416 is configured as a continuous ridge that surrounds the periphery of the microfluidic circuit, e.g., microchannel 416 and inlet/outlet reservoir 412. The microfluidic circuit and patterned ridge structure 416 thus are substantially coplanar with one another. For example, in the illustrated embodiment the width of microchannel 416 is defined by spaced-apart, opposing ridge structure 416 wall sections arranged substantially parallel to one another. Microchannel 416 is aligned with one or more of the electrodes, e.g., the electrode is contained in or disposed under microchannel 416. In this embodiment, the micro knife edge structure 410 performs a dual role, not only enabling a robust fluid seal to the compressive sealing layer 418 (e.g., PDMS gasket), but also defining the sidewalls of the microfluidic channel 416 (analogous to 216 in FIG. 7).

Gray-scale lithography may be employed to tailor the vertical profile (3-D shape) of narrow ridge member 410, i.e. micro knife edge, and thereby to optimize the efficacy and reliability of the seal. Gray scale lithography allows a rounded top to the micro knife edge, or a sharper, roughly triangular top, where strongest contact with the flexible sealing layer occurs. Other profiles are also possible.

A reactive layer (not shown in FIG. 9) is deposited over the first electrode in microchannel 416. The reactive layer of the fourth embodiment may comprise the same materials (e.g., chitosan) and is capable of conjugation to the same molecules as described above in connection with the first embodiment. It is to be understood that although this fourth embodiment is described herein as including electrodes and a reactive layer, the invention in its broader aspects encompasses MEMS devices and methods without electrodes and/or reactive layers, which may be omitted from the fourth embodiment. For example, the MEMS device may be used to control flow of a fluid (i.e., a liquid and/or gas) through micro-channel 416, without performing deposition of a reactive layer over an electrode in micro-channel 416.

A compressible sealing layer 418 is situated over patterned ridge structure 410 to cover microchannel 412. Sealing layer 418 may be made of the same materials (e.g., PDMS) and may be made using the same methods as described above in connection with membrane 118 and sealing layer 318. An upper substrate layer 480 optionally is situated over sealing layer 418. Upper substrate layer 480 preferably is transparent, and may be made of, for example, a plexiglass wafer. Sealing layer 418 and upper substrate layer 480 collectively define input/output port 422 for permitting the introduction of fluid to and/or removal of fluid from reservoir 412.

A compressive force is shown applied to the upper surface of upper substrate layer 480 and the lower surface of lower substrate 402. When MEMS device 400 is placed under compression, sealing layer 418 is compressed against patterned ridge structure 410, causing ridge 410 to apply stress to and deform sealing layer 418 at contact areas along ridge 410. The applied compressive force is preferably substantially uniform and sufficient to establish a substantially leak-tight seal around the periphery of microchannel 416 and any related microfluidic circuit structures, i.e., along the path of the ridge 410. Advantageously, the leak-tight seal is established without requiring the use of adhesives or elevated temperatures.

Fifth Embodiment

Figure 10:
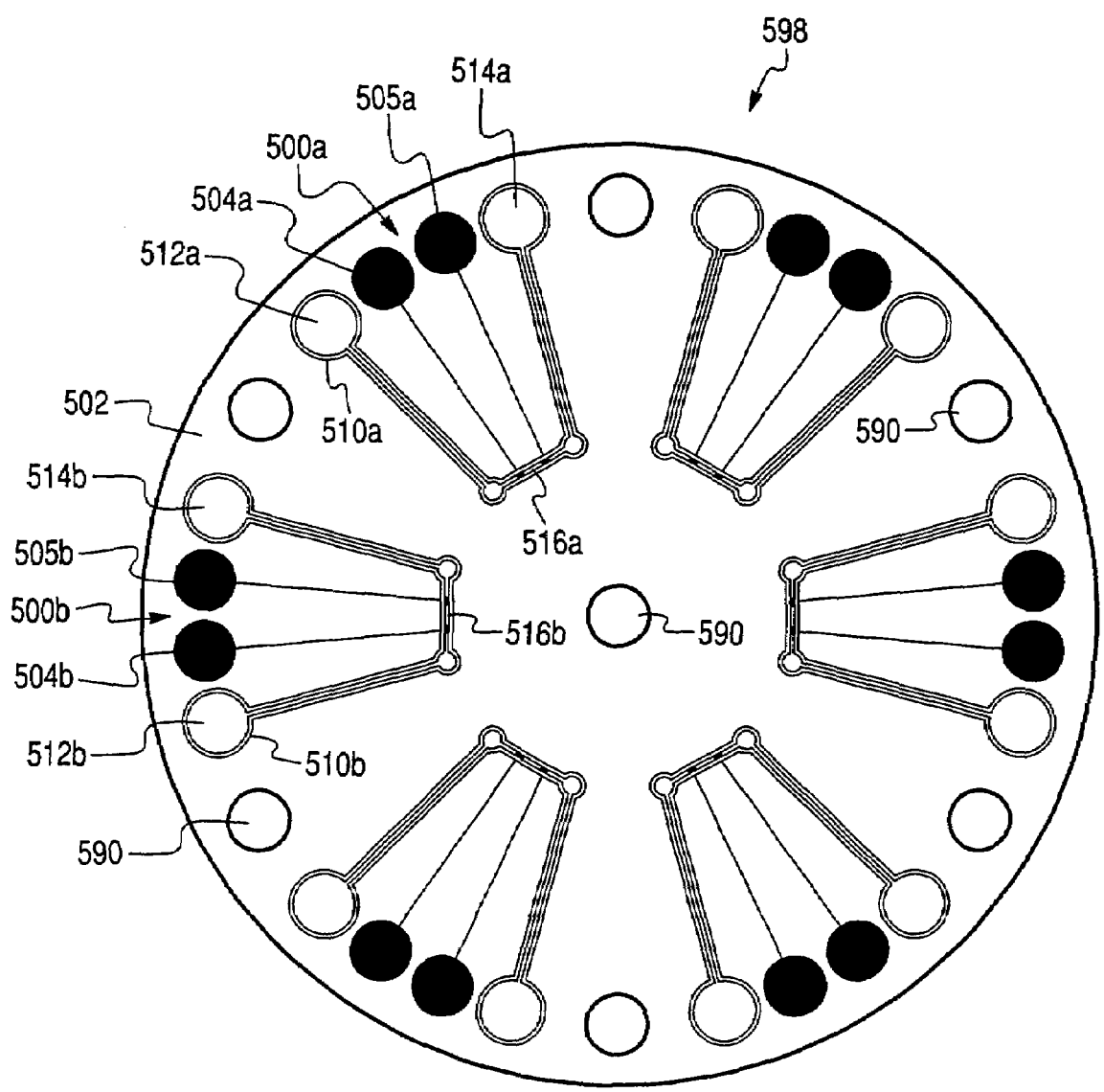
FIG. 10 is an overhead plan view of an apparatus comprising a plurality of micro-electro-mechanical system (MEMS) devices according to a fifth embodiment of the invention.

FIG. 10 illustrates an overhead plan view of an apparatus 598 comprising a plurality of micro-electro-mechanical system (MEMS) devices. Apparatus 598 comprises a common substrate 502 comprising a plurality (i.e., six (6) in the illustrated embodiment) of MEMS devices. Common substrate 502 has a plurality of through holes 590. Common substrate 502 contains six (6) through holes 590 equally spaced apart from one another in an annular arrangement spaced radially inward from the outer periphery of common substrate 502. A seventh through hole 590 is located at the center of common substrate 502. Each of through holes 590 is sized to receive a respective clamping member similar to the clamp mechanism 390 shown in FIG. 8.

A first MEMS device 500a located on common substrate 502 comprises a first electrode 504a and a second electrode 505a. Preferably, one of the electrodes is an anode and the other a cathode. MEMS device 500a further comprises a continuous ridge structure 510a disposed on and protruding upward from common substrate 502. Ridge structure 510a defines a circular first reservoir 512a and a circular second reservoir 514a, one of which is designated an input reservoir and the other of which is designated an output reservoir. Each of reservoirs 512a and 514a has an opening, which is defined at its periphery by ridge structure 510a. Ridge structure 510a forms a continuous microchannel 516a that fluidly connects reservoirs 512a and 514a at their respective openings. In the illustrated embodiment, microchannel 516a begins at first reservoir 512a opening, extends radially inward to a first intermediate reservoir, changes direction to travel generally circumferentially yet in a straight path to pass over first electrode 504a and second electrode 505a until reaching a second intermediate reservoir, then extends radially outward until terminating at the opening of second reservoir 514a. Microchannel 516a thus places reservoirs 512a and 514a in fluid communication with one another. Microchannel 516a also allows for delivery of fluid to electrodes 504a and 505a. In this manner, a reactive layer or its precursor, with or without conjugated molecules, can be delivered to electrodes 504a, 505a for deposition. Also, conjugatable molecules may be delivered to a reactive layer deposited on electrodes 504a, 505a.

The remaining MEMS devices located on common substrate 502 are substantially identical in construction to device 500a discussed above. Reference numerals containing a suffix "b", but otherwise using like numbers to those discussed above, represent like components and features of a second MEMS device 500b. The components (e.g., ridge structure 510a, etc.) of apparatus 598 are made of similar materials and serve similar functions to like components described above in connection other embodiments of the invention.

Methods of Operation

A non-exhaustive description of methods for operating the embodied MEMS devices will now be discussed with reference to FIG. 1, and in connection with chitosan as the reactive layer. The embodied methods may be modified as discussed above to use different reactive layers.

According to a first embodied deposition method, chitosan conjugated to a biocompatible molecule is dissolved into an aqueous solution at an acidic pH and introduced through inlet port 122 to inlet reservoir 112. Such motion may be accomplished by pressure-driven flow or through electrokinetic flow (e.g., electro-osmotic flow). The dissolved polymer with conjugated molecule travels along microchannel 116 and reaches the vicinity of cathode electrode 104. If negative voltage is applied to cathode electrode 104, the chitosan will deposit as the reactive layer on cathode electrode 104. The reactive layer may be maintained in an insolubilized state by maintaining the applied voltage. Alternatively, if the pH of the fluid in microchannel 116 is raised to basic levels, the insolubility of the chitosan reactive layer is improved, eventually reaching a state at which the voltage may be removed without solubilizing the chitosan.

If it is desired to remove the chitosan reactive layer, this can be subsequently accomplished by lowering or removing the applied negative voltage and changing the pH back to acidic levels. The dissolved chitosan with conjugated molecules then flow through microchannel to outlet reservoir 114, where the fluid may be removed through outlet port 124 using, e.g., pressure driven flows, pumps, etc.

According to a second embodied deposition method, chitosan without a conjugated molecule is dissolved into an aqueous solution at an acidic pH and introduced through inlet port 122 to inlet reservoir 112. The dissolved polymer is passed along microchannel 116 and deposited on cathode electrode 104. pH stabilization may be conducted as discussed above. The molecule to be conjugated (or conjugatable molecule) is then introduced in aqueous solution into the inlet port 122 to inlet reservoir 112, and likewise is passed to cathode electrode 104, where conjugation occurs.

According to a third embodied deposition method, prior to securing membrane 118 to patterned layer 106, chitosan without a conjugated molecule is electrodeposited on cathode electrode 104 of exposed microchannel 116. Encapsulating membrane 118 is then placed on patterned layer 106, and the conjugated molecule is introduced through inlet port 122 as discussed above.

According to a fourth embodied method, the MEMS devices described above are used to transport a fluid through a microchannel, preferably between reservoirs. The fluid may comprise a liquid (e.g., an aqueous solution) or gas. The fluid may contain or omit a solubilized reactive layer or reactive layer precursor. Optionally, gates and flow control devices may be arranged along the micro-channel and controlled using, for example, electrochemistry.

The bioMEMS packaging strategy embodied in this detailed description greatly facilitates the development and use of bioMEMS and microfluidic systems by providing robust means for generating leak-tight flow systems, versatile packaging and operation, and bioreaction processes. In this broader sense, and particularly for commercial biotechnology applications, bioMEMS fabrication and integration requires packaging that efficiently and easily accommodates inputs and outputs to the bioMEMS wafer, chip or device. A packaging design has been developed which accommodates not only the fluidic interconnects, but also electrical and ultimately optical interconnects to the bioMEMS wafer. Given the increasing complexity of bioMEMS wafers in terms of the number of inputs/outputs involved, such a packaging strategy is valuable.

Further, the construction of preferred embodiment permits the use of transparent materials over the microchannel. As a consequence, active areas are left accessible to a microscope for observation.

Advantageously, this invention facilitates the reuse of bioMEMS wafers or chips. After operation or testing of one bioMEMS wafer, the fluidic flow system can be used to blow out the microchannels, flow valves from the controller closed, and electrical power turned off. Then the top frame can be removed, the wafer removed, and a new wafer inserted. The top frame is then reattached, and operation of the new wafer is initiated. This strategy can be accomplished quickly to achieve rapid throughput of packages.

In particular, it should be noted that microfluidic devices and circuits may be of value in applications not involving electrical activation, reactive biopolymers, or biomolecules. The concepts and designs described herein and not directly related to electrical or biological functionality are equally applicable and valuable to other microfluidic systems and applications, including the fluidic sealing methods, the integration of fluidic inputs and outputs, the fabrication of microfluidic structures, etc.

EXAMPLE

A process flow for fabricating the SU-8 fluid flow wafer and PDMS gasket was carried out as follows.

Clean the first wafer (for channels and micro-knife-edges) in preparation for processing. Electrodes may have been deposited and patterned previously.

Use a spin-coating machine to spin on the first layer of SU-8 50 to the thickness desired for the fluid flow layer (130 microns in the current experiment). Bake the wafer for the appropriate amount of time, and then expose it to ultraviolet light using a mask that blocks the light where the channels and reservoirs are to be defined. (Since SU-8 is a negative photoresist, regions of the wafer exposed to ultraviolet light will remain while the unexposed portions are developed away.)

After exposure of the first layer, spin on the second layer of SU-8 50 to the thickness desired for the micro-knife-edges (80 microns in the current experiment). Bake the wafer, now with two layers of SU-8, for the appropriate amount of time. Expose the wafer for a second time using a mask that blocks the light in all areas except where the micro-knife-edges are to be defined, aligning carefully to the pattern from the previous exposure. Perform the final post-exposure bake, and then develop the wafer in SU-8 developer (MicroChem, Inc.). The fluid flow wafer is now complete.

Clean a second wafer (bare silicon, for gasket molding) in preparation for processing.

Spin-coat the wafer with SU-8 50 to a thickness slightly higher than that desired for the PDMS gasket (130 microns in the current experiment). Bake the wafer for the appropriate amount of time, and then expose it to ultraviolet light using a mask that blocks the light in all areas except the inlet/outlet locations where the gasket should have holes. Perform the final post-exposure bake, and then develop the wafer in SU-8 developer. The gasket mold is now complete.

Mix PDMS (Sylgard 184, Dow Corning) in a 10:1 ratio of base to curing agent. Spin-coat the PDMS on the prepared mold wafer to the desired thickness (approximately 100 microns in the current experiment). Cure the PDMS in a box furnace for two hours at 70° C.

Release the PDMS gasket from the mold by loosening the edges of the PDMS with a sharp blade, submerging the wafer in methanol, and peeling the gasket from the mold with tweezers (while keeping it under the methanol). Remove the mold wafer, leaving the gasket floating in the dish of methanol.

Slide the fluid flow wafer into the dish of methanol, under the PDMS gasket, and lift it out, thereby "floating" the gasket onto the wafer. While the wafer is still wet, align the holes in the PDMS gasket with the inlet/outlet reservoirs on the fluid flow wafer.

Use a roller to remove bubbles and excess methanol from the gasket-wafer combination. Allow the wafer to dry before testing. (As the PDMS dries, it will form a temporary seal to the SU-8 surface, but it can still be peeled off and repositioned easily.)

Masks may be designed to create various geometries of microchannels and knife-edges. For example, the geometries may include 90-degree bends, curves, straight lines, etc. Channel size may be controlled over a broad range, and may be maintained uniform or varied, e.g., 30 microns to 750 microns. Similarly, micro-knife edge height and spacing from the channels could be controlled in a likewise manner. Using a WYCO NT1100 optical profiler (Veeco Instruments), channel depth was measured as 130 microns and micro-knife-edge height as 80 microns.

A completed microfluidic wafer with channels, micro-knife-edges, and gasket can then be clamped in the transparent packaging designed for simple fluid and electrical interfacing. So packaged, fluid can be pumped into and out of any selected inlet/outlet combination using an external peristaltic pump (Masterflex® L/S® variable-speed economy drive, Cole-Parmer Instrument Company) and valve manifold.

Fluid channels without micro-knife edges have been found to be leak-tight for continuous flow up to approximately five minutes at a flow rate of 1.0 mL/min. Small leaks have been found to occur after more than five minutes of flow, especially when fluid must be pumped upward (against gravity) for a long period of time. However, these leaks do not prevent fluid from continuing to flow through the channel and out the outlet, so experiments could continue in the channel being tested. (In contrast, when channels are sealed without micro-knife-edges, leaks occur immediately at the inlet and flow cannot be achieved through the channel at all.) This level of leak-tightness has been shown for channels with 90-degree bends and curves; for channels 500, 300, and 100 microns wide; and for micro-knife-edges 500 microns wide and 500 microns from the edge of the fluid.

The foregoing detailed description of the preferred embodiments of the invention has been provided for the purpose of explaining the principles of the invention and its practical application, thereby enabling others skilled in the art to understand the invention for various embodiments and with various modifications as are suited to the particular use contemplated. This description is not intended to be exhaustive or to limit the invention to the precise embodiments disclosed. Modifications and equivalents will be apparent to practitioners skilled in this art and are encompassed within the appended claims.

What is claimed is:

1. A micro-electro-mechanical system (MEMS) device, comprising:
   a substrate;
   a patterned structure on the substrate, the patterned structure having a microchannel; and
   an encapsulation layer covering the microchannel, the encapsulation layer being reversibly attachable and separable with respect to the patterned structure;
   wherein:
   the patterned structure comprises an epoxy; and
   the encapsulation layer comprises polydimethylsiloxane.

2. A micro-electro-mechanical system (MEMS) device, comprising:
   a substrate;
   a patterned structure on the substrate, the patterned structure having a microchannel; and
   an encapsulation layer covering the microchannel, the encapsulation layer being reversibly attachable and separable with respect to the patterned structure;
   wherein the patterned structure comprises SU-8.

3. A micro-electro-mechanical system (MEMS) device, comprising:
   a substrate;
   a patterned structure on the substrate, the patterned structure having a microchannel; and
   an encapsulation layer covering the microchannel, the encapsulation layer being reversibly attachable and separable with respect to the patterned structure;
   further comprising first and second electrodes situated on the substrate, the first electrode being aligned with the microchannel
   wherein the first electrode comprises polypyrrole.

4. A micro-electro-mechanical system (MEMS) device, comprising:
   a substrate;
   a patterned structure on the substrate, the patterned structure having a microchannel; and
   an encapsulation layer covering the microchannel, the encapsulation layer being reversibly attachable and separable with respect to the patterned structure;
   further comprising first and second electrodes situated on the substrate, the first electrode being aligned with the microchannel; and
   further comprising a reactive layer deposited over the first electrode in the microchannel.

5. The device of claim 4, wherein the reactive layer comprises chitosan.

6. The device of claim 4, further comprising biomolecules or cells conjugated to the reactive layer.

7. A micro-electro-mechanical system (MEMS) device, comprising:
   a substrate;
   a patterned structure on the substrate, the patterned structure comprising SU-8 and having a microchannel; and
   a polydimethylsiloxane encapsulation layer covering the microchannel.

8. The device of claim 7, wherein the encapsulation layer has a fluid inlet port and a fluid outlet port, the microchannel connecting the fluid inlet and outlet ports to one another.

9. The device of claim 7, further comprising first and second electrodes situated on the substrate, the first electrode being aligned with the microchannel.

10. The device of claim 9, wherein the first electrode comprises polypyrrole.

11. The device of claim 9, further comprising a reactive layer deposited over the first electrode in the microchannel.

12. The device of claim 11, wherein the reactive layer comprises chitosan.

13. The device of claim 11, further comprising biomolecules or cells conjugated to the reactive layer.

14. A micro-electro-mechanical system (MEMS) device, comprising:
a substrate;
a patterned structure on the substrate, the patterned structure comprising an inlet reservoir, an outlet reservoir, and a microchannel; and
an encapsulation layer covering the microchannel, the encapsulation layer comprising a fluid inlet port in fluid communication with said inlet reservoir and a fluid outlet port in fluid communication with said outlet reservoir;
wherein:
the patterned structure comprises an epoxy; and
the encapsulation layer comprises polydimethylsiloxane.

15. A micro-electro-mechanical system (MEMS) device, comprising:
a substrate;
a patterned structure on the substrate, the patterned structure comprising an inlet reservoir, an outlet reservoir, and a microchannel; and
an encapsulation layer covering the microchannel, the encapsulation layer comprising a fluid inlet port in fluid communication with said inlet reservoir and a fluid outlet port in fluid communication with said outlet reservoir;
wherein the patterned structure comprises SU-8.

16. A micro-electro-mechanical system (MEMS) device, comprising:
a substrate;
a patterned structure on the substrate, the patterned structure comprising an inlet reservoir, an outlet reservoir, and a microchannel; and
an encapsulation layer covering the microchannel, the encapsulation layer comprising a fluid inlet port in fluid communication with said inlet reservoir and a fluid outlet port in fluid communication with said outlet reservoir;
further comprising:
a first wafer adjacent to the substrate and on an opposite side of the substrate relative to the patterned structure; and
a second wafer adjacent to the encapsulation layer and on an opposite side of the encapsulation layer relative to the patterned structure, the second wafer comprising an inlet channel and an outlet channel in fluid communication with the fluid inlet reservoir and the fluid outlet reservoir, respectively.

17. The device of claim 16, further comprising:
a first frame on an opposite side of the first wafer relative to the substrate; and
a second frame on an opposite side of the second wafer relative to the encapsulation layer, the second frame comprising a frame inlet channel and a frame outlet channel in fluid communication with the fluid inlet reservoir and the fluid outlet reservoir, respectively.

18. The device of claim 17, further comprising a gasket layer between the first frame and the first wafer.

19. The device of claim 18, further comprising a compression mechanism applying a compressive force to outer surfaces of the first and second frames.

20. A micro-electro-mechanical system (MEMS) device, comprising:
a substrate;
a patterned structure on the substrate, the patterned structure comprising an inlet reservoir, an outlet reservoir, and a microchannel; and
an encapsulation layer covering the microchannel, the encapsulation layer comprising a fluid inlet port in fluid communication with said inlet reservoir and a fluid outlet port in fluid communication with said outlet reservoir;
further comprising first and second electrodes situated on the substrate, the first electrode being aligned with the microchannel;
wherein the first electrode comprises polypyrrole.

21. A micro-electro-mechanical system (MEMS) device, comprising:
a substrate;
a patterned structure on the substrate, the patterned structure comprising an inlet reservoir, an outlet reservoir, and a microchannel; and
an encapsulation layer covering the microchannel, the encapsulation layer comprising a fluid inlet port in fluid communication with said inlet reservoir and a fluid outlet port in fluid communication with said outlet reservoir;
further comprising first and second electrodes situated on the substrate, the first electrode being aligned with the microchannel;
further comprising a reactive layer deposited over the first electrode in the microchannel.

22. The device of claim 21, wherein the reactive layer comprises chitosan.

23. The device of claim 21, further comprising biomolecular molecules or cells conjugated to the reactive layer.

24. A micro-electro-mechanical system (MEMS) device, comprising:
a substrate;
a patterned structure on the substrate, the patterned structure comprising a first layer and a second layer, the first layer having a microchannel, the second layer comprising a ridge protruding from the first layer and surrounding the microchannel; and
a compressible sealing layer covering the microchannel and compressed against the ridge to provide a leak-tight seal.
wherein:
the patterned structure comprises an epoxy; and
the compressible sealing layer comprises polydimethylsiloxane.

25. A micro-electro-mechanical system (MEMS) device, comprising:
a substrate;
a patterned structure on the substrate, the patterned structure comprising a first layer and a second layer, the first layer having a microchannel, the second layer comprising a ridge protruding from the first layer and surrounding the microchannel; and
a compressible sealing layer covering the microchannel and compressed against the ridge to provide a leak-tight seal;
wherein the patterned structure comprises SU-8.

26. A micro-electro-mechanical system (MEMS) device, comprising:
a substrate;
a patterned structure on the substrate, the patterned structure comprising a first layer and a second layer, the first layer having a microchannel, the second layer comprising a ridge protruding from the first layer and surrounding the microchannel; and a compressible sealing layer covering the microchannel and compressed against the ridge to provide a leak-tight seal;

wherein:

the patterned structure further has a fluid inlet reservoir and a fluid outlet reservoir, the microchannel connecting the fluid inlet and outlet reservoirs to one another; and the encapsulation layer comprises a fluid inlet port in fluid communication with the inlet reservoir and a fluid outlet port in fluid communication with the outlet reservoir;

further comprising:

a first wafer adjacent to the substrate and on an opposite side of the substrate relative to the patterned structure; and a second wafer adjacent to the encapsulation layer and on an opposite side of the compressible sealing layer relative to the patterned structure, the second wafer comprising an inlet channel and an outlet channel in fluid communication with the fluid inlet reservoir and the fluid outlet reservoir, respectively.

27. The device of claim 26, further comprising:

a first frame on an opposite side of the first wafer relative to the substrate;

a second frame on an opposite side of the second wafer relative to the compressible sealing layer, the second frame comprising a frame inlet channel and a frame outlet channel in fluid communication with the fluid inlet reservoir and the fluid outlet reservoir, respectively; and a clamp mechanism applying a compressive force to outer surfaces of the first and second frames and establishing the leak-tight seal between the patterned structure and the compressible sealing layer.

28. A micro-electro-mechanical system (MEMS) device, comprising:

a substrate;

a patterned structure on the substrate, the patterned structure comprising a first layer and a second layer, the first layer having a microchannel, the second layer comprising a ridge protruding from the first layer and surrounding the microchannel; and a compressible sealing layer covering the microchannel and compressed against the ridge to provide a leak-tight seal;

further comprising first and second electrodes situated on the substrate, the first electrode being aligned with the microchannel;

wherein the first electrode comprises polypyrrole.

29. A micro-electro-mechanical system (MEMS) device, comprising:

a substrate;

a patterned structure on the substrate, the patterned structure comprising a first layer and a second layer, the first layer having a microchannel, the second layer comprising a ridge protruding from the first layer and surrounding the microchannel; and a compressible sealing layer covering the microchannel and compressed against the ridge to provide a leak-tight seal;

further comprising first and second electrodes situated on the substrate, the first electrode being aligned with the microchannel;

further comprising a reactive layer deposited over the first electrode in the microchannel.

30. The device of claim 29, wherein the reactive layer comprises chitosan.

31. The device of claim 29, further comprising biomolecules or cells conjugated to the reactive layer.

32. A micro-electro-mechanical system (MEMS) device, comprising:

a substrate;

a patterned ridge structure on the substrate, the patterned ridge structure forming and surrounding a microchannel; and a compressible sealing layer covering the microchannel and compressed against the ridge structure to provide a leak-tight seal;

wherein:

the patterned ridge structure comprises an epoxy; and the compressible sealing layer comprises polydimethylsiloxane.

33. A micro-electro-mechanical system (MEMS) device, comprising:

a substrate;

a patterned ridge structure on the substrate, the patterned ridge structure forming and surrounding a microchannel; and a compressible sealing layer covering the microchannel and compressed against the ridge structure to provide a leak-tight seal;

wherein the patterned ridge structure comprises SU-8.

34. A micro-electro-mechanical system (MEMS) device, comprising:

a substrate;

a patterned ridge structure on the substrate, the patterned ridge structure forming and surrounding a microchannel; and a compressible sealing layer covering the microchannel and compressed against the ridge structure to provide a leak-tight seal;

wherein:

the patterned ridge structure further has a fluid inlet reservoir and a fluid outlet reservoir, the microchannel connecting the fluid inlet and outlet reservoirs to one another; and the compressible sealing layer comprises a fluid inlet port in fluid communication with the inlet reservoir and a fluid outlet port in fluid communication with the outlet reservoir further comprising:

a first wafer adjacent to the substrate and on an opposite side of the substrate relative to the patterned ridge structure; and a second wafer adjacent to the compressible sealing layer and on an opposite side of the compressible sealing layer relative to the patterned ridge structure, the second wafer comprising an inlet channel and an outlet channel in fluid communication with the fluid inlet reservoir and the fluid outlet reservoir, respectively.

35. The device of claim 34, further comprising:

a first frame on an opposite side of the first wafer relative to the substrate;

a second frame on an opposite side of the second wafer relative to the compressible sealing layer, the second frame comprising a frame inlet channel and a frame outlet channel in fluid communication with the fluid inlet reservoir and the fluid outlet reservoir, respectively; and a clamp mechanism applying a compressive force to outer surfaces of the first and second frames and establishing the leak-tight seal between the compressible sealing layer and the patterned ridge structure.

36. A micro-electro-mechanical system (MEMS) device, comprising:
a substrate;
a patterned ridge structure on the substrate, the patterned ridge structure forming and surrounding a microchannel; and
a compressible sealing layer covering the microchannel and compressed against the ridge structure to provide a leak-tight seal;

further comprising first and second electrodes situated on the substrate, the first electrode being aligned with the microchannel.

37. The device of claim 36, wherein the first electrode comprises polypyrrole.

38. The device of claim 36, further comprising a reactive layer deposited over the first electrode in the microchannel.

39. The device of claim 38, wherein the reactive layer comprises chitosan.

40. The device of claim 38, further comprising biomolecules or cells conjugated to the reactive layer.

* * * * *